United States Patent [19]
Mei et al.

[11] Patent Number: 6,031,248
[45] Date of Patent: Feb. 29, 2000

[54] HYBRID SENSOR PIXEL ARCHITECTURE

[75] Inventors: Ping Mei, Palo Alto, Calif.; Andrew J. Moore, Dallas, Oreg.; Raj B. Apte, Palo Alto, Calif.; Steven E. Ready, Santa Cruz, Calif.; Robert A. Street, Palo Alto, Calif.; James B. Boyce, Los Altos, Calif.

[73] Assignee: Xerox Corporation, Stamford, Conn.

[21] Appl. No.: 09/067,657

[22] Filed: Apr. 28, 1998

[51] Int. Cl.$^7$ .................. H01L 29/04; H01L 31/036; H01L 31/0376; H01L 31/20; H01L 29/46

[52] U.S. Cl. .................. 257/59; 257/57; 257/66; 257/67; 257/69; 257/72

[58] Field of Search .................. 257/57, 59, 66, 257/67, 69, 72

[56] References Cited

U.S. PATENT DOCUMENTS

| | | | |
|---|---|---|---|
| 4,407,010 | 9/1983 | Baji et al. | 358/213 |
| 4,758,896 | 7/1988 | Ito . | |
| 4,876,668 | 10/1989 | Thakror et al. . | |
| 4,954,895 | 9/1990 | Akimoto et al. | 358/213.11 |
| 5,017,989 | 5/1991 | Street et al. | 357/30 |
| 5,243,202 | 9/1993 | Mori et al. | 257/59 |
| 5,262,649 | 11/1993 | Antonuk et al. | 250/370.09 |
| 5,366,926 | 11/1994 | Mei et al. | 437/173 |
| 5,539,461 | 7/1996 | Andoh et al. | 348/308 |

OTHER PUBLICATIONS

L.E. Antonuk, J. Boudry, C.W. Kim, M. Longo, E.J. Morton, J. Yorkston, Signal, Noise, and Readout Considerations in the Development of Amorphous Silicon Photodiode Arrays for Radiotherapy and Diagnostic X–Ray Imaging,*SPIE*, vol. 1443, Medical Imaging V: Image Physics, 1991, P. 108–119.

T. Aoyama, K. Ogawa, Y. Mochizuki, N. Konishi, Inverse Staggered Polycrystalline and Amorphous Silicon Double Structure Thin Film Transistors, *Appl. Phys. Lett.*, vol. 66, No. 22, May 29, 1995, P. 3007–3009.

S.S. He, D.J. Stephens, G. Lucovsky, Improved Electrical Performance of a–Si:H Thin Film Transistors, TFTs With n+uc–Si Contact, and Silicon Oxide and Nitride Dual–Layer Dielectrics, Materials Research Society Symp. Proc., vol. 297, 1993, P. 871–876.

S. Kawai, T. Kodama, Y. Nasu, S. Yanagisawa, K. Asama, A Self–Alignment Processed a:Si:H TFT Matrix Circuit for LCD Panels, Proceedings of the SID, vol. 25/1, 1984, P. 21–24.

T. Serikawa, S. Shirai, A. Okamoto, S. Suyama, Low–Temperature Fabrication of High–Mobility Poly–Si TFT'S for Large–Area LCD'S,*IEEE Transactions on Electron Devices*, vol. 36, No. 9, Sep. 1989, P. 1929–1933.

K. Shimizu, O. Sugiura, M. Matsumura, On–Chip Bottom–Gate Polysilicon and Amorphous Silicon Thin–Film Transistors Using Excimer Laser Annealing,*Japanese Journal of Applied Physics*, vol. 29, No. 10, Oct. 1990. P. L1775–L1777.

K. Shimizu, H. Hosoya, O. Sugiura, High–Mobility Bottom–Gate Thin–Film Transistors With Laser–Crystallized and Hydrogen–Radical–Annealed Polysilicon Films,*Japanese Journal of Applied Physics*, Part 1, vol. 30, No. 12B, 1991, P. 3704–3709.

(List continued on next page.)

*Primary Examiner*—Stephen D. Meier

[57] ABSTRACT

A pixel circuit construction for image sensing includes a photosensor, an amplifier, a selector switch and, and a reset switch. The amplifier may be a single polycrystalline silicon (channel) transistor for high gain. The selector switch may also be a single polycrystalline silicon (channel) transistor for high conductivity. The reset switch may a single amorphous crystalline silicon (channel) transistor for low leakage current. The photosensor and amplifier may be connected to a shared bias line or may be connected to separate bias and drive lines, respectively. The selector and reset switches may be connected to a shared data line or may be connected to separate data and reset lines, respectively. Laser crystallization and rehydrogenation techniques are well suited to obtaining devices described herein.

15 Claims, 19 Drawing Sheets

OTHER PUBLICATIONS

R.A. Street, S. Nelson, Amorphous Silicon Sensor Arrays for Radiation Imaging, Materials Research Society Symp. Proc., vol. 192, 1990, P. 441–452.

T. Tanaka, H. Asuma, K. Ogawa, Y. Shinagawa, K. Ono, N. Konishi, An LCD Addressed by a–Si:H TFTS with Peripheral Poly–Si TFT Circuits, IEEE, 1993, P. 389–392.

J. Yorkston, L.E. Antonuk, E.J. Morton, J. Boudry, W. Huang, C.W. Kim, M.J. Longo, R.A. Street, The Dynamic Response of Hydrogenated Amorphous Silicon Imaging Pixels, Materials Research Society Symp. Proc., vol. 219, 1991, P. 173–178.

T. Delbrück and C.A. Mead, Analog VLSI Phototransduction by Continuous–Time, Adaptive, Logarithmic Photoreceptor Circuits, California Institute of Technology, Computation and Neural Systems Program, Oct. 18, 1993. P. 1–23.

Tobi Delbrück and Carver A. Mead, Time–Derivative Adaptive Silicon Photoreceptor Array, *SPIE*, Infrared Sensors: Detectors, Electronics, and Signal Processing, vol. 1541, 1991, P. 92–99.

Tobias Delbr'uck, Investigations of Analog VLSI Visual Transduction and Motion Processing, UMI Dissertation Services, Degree Date: 1993, P. 1–176.

HYBRID SENSOR PIXEL ARCHITECTURE

BACKGROUND

The present invention relates generally to the field of sensors, and more particularly to an improved pixel architecture with increased signal to noise ratio and minimal decrease in fill factor.

Two-dimensional large-area sensor arrays have wide ranging applications in medical imaging, optical scanning, chemical or radiation detection, temperature sensing, and other arts. Such sensors comprise a grid of pixels, with each pixel composed of at least a sensor device and one or more transistors comprising a circuit for converting sensory data (such as optical images, x-ray images with or without the assistance of a scintillation layer, chemical presence, temperature, etc.) to electrical signals (typically data used for processing, storing, driving a display or an alarm, etc.) The sensor is generally a reverse biased diode, and the transistor(s) is generally a thin-film field effect transistor (TFT). Conveniently, each of the components of the pixel may be formed of hydrogenated amorphous silicon (a-Si) to take advantage of the ease of fabrication of large area arrays, low leakage current devices, and other benefits of using this amorphous material. (A component will be referred to herein as being formed of a-Si when at least one layer of the component is formed of said material. For example, as used herein, an a-Si TFT refers to a thin film transistor having an amorphous silicon channel layer.)

It should be clear from the above that the sensors of the type relevant to the present invention are designed to sense one or more of a variety of sensory data (e.g., light, radiation, chemical, thermal, etc.). An important subset of this group of sensors is comprised of sensors optimized to sense image data. While the discussions herein are broadly applicable to sensory data, the following discussion will focus on image data for clarity of explanation.

It is known that a critical parameter of an array of image sensors is the signal to noise ratio of the array. Namely, a reduction of noise as compared to signal is generally desirable. Signal amplifiers are typically employed to boost sensed signals for downstream use. It is common practice to connect an entire row of image sensors to a single amplifier. There are numerous advantages to this architecture, including minimizing the number of contacts to the array, maximizing the fill factor (defined as the fraction of the area of the array sensitive to the incident image), etc.

However, the noise in such an architecture is related to both the readout noise due to the large capacitance of the long data line, and the pixel noise which is a function of the pixel architecture itself and which is amplified together with the signal itself. For example, the thermal noise of the readout amplifier is proportional to the capacitance on the input of the amplifier.

Accordingly, it has been suggested that each pixel be provided with its own amplifier circuitry. In copending U.S. patent application Ser. No. 08/699,875, to Street et al. (referred to herein as "Street et al."), a pixel circuit and array incorporating such a circuit is disclosed. Typically, such a circuit consists of a photosensor with inherent capacitance for storing a charge under reversed bias conditions. The stored charge is depleted by light incidence. Determining the intensity of the incident light is accomplished by examining the remaining charge in the photosensor. The photosensor may be connected in reverse bias mode between a data line and a bias line. The photosensor is connected to a transistor or transistors such that the voltage through the transistor(s), between the bias line and the data line, is a function of the amount is of light incident upon the photosensor. This structure is referred to as an amplified pixel.

In addition to increasing the signal to noise ratio, it is also a perennial goal in the image sensor art to provide increased resolution from sensor arrays. For example, a pixel having an area on the order of $(150 \,\mu m)^2$, as taught by Street et al., corresponds to a resolution of approximately 170 dpi, and qualifies as a low resolution sensor by current measures.

It is generally understood that reducing pixel area is a means of increasing resolution. However, there are several penalties generally paid when pixel area is reduced. The first is that the area of the photosensor is reduced. This results in a decrease in sensitivity of the photosensor. The second is that one or more of the dimensions of the pixel transistors are reduced. In the case of an amplified pixel, this runs the risk of reducing gain below an acceptable threshold. For example, in the case of a single transistor amplifier, an a-Si TFT with a ratio of channel width (W) to channel length (L) of 4 provides a desired gain of approximately 10. A reduction in the width to length ratio (W/L), however, results in a reduction in gain. The combination of current process limitations leading to a minimum device dimension of $L \geq 5$ $\mu m$ for a-Si devices, combined with the low carrier mobility of a-Si, means that a channel of $5 \,\mu m \times 20 \,\mu m$ is as small as current technology will permit while providing adequate gain. However, there is a desire to overcome this barrier and produce smaller pixels for increased resolution.

It will be appreciated that there are two parameters of a sensor circuit at odds with the desire to reduce pixel size. The first is the desire to maximize the sensitivity of the pixel. This can be accomplished by increasing the physical size of the photosensor part of the circuit, but at the cost of increasing the entire pixel size. Rather than increasing pixel size, it is common in the art to increase the area of the cell dedicated to the photosensor, referred to as the fill factor. As between two sensor pixels who differ only in photosensor area, the one with the larger photosensor area (greater fill factor) will generally provide better sensitivity. However, for a given pixel size, generally the larger the area occupied by transistor(s), the smaller the area available for the photosensor. Given the lower limit on transistor size, a tradeoff must therefore be made between resolution and sensitivity.

The second parameter at odds with the desire to reduce pixel size is the complexity of the circuit. A minimal circuit requires a photosensor and a selector switch (e.g., a transistor). However, this circuit does not address the need to do any amplification or in situ signal processing, etc. While the added circuitry is desirable from a pixel performance perspective, it undesirably consumes pixel area (and reduces yield). A tradeoff must thus be made between pixel size or fill factor and circuit complexity.

SUMMARY

The present invention is a novel pixel circuit construction which overcomes the limitations of the prior art. The present invention provides the ability to fabricate sensor pixels which provide the required gain with channel dimensions less than $5 \,\mu m \times 20 \,\mu m$. Likewise, the present invention allows increasing the fill factor for a given size pixel by reducing the transistor dimensions, without sacrificing gain. Increased levels of pixel circuit complexity may be employed while minimizing the added size of the pixel and/or maximizing the fill factor, without sacrificing signal gain.

The present invention is based on the understanding that polycrystalline silicon (poly-Si) provides improved carrier mobility as compared to a-Si. By fabricating selected ones of the transistors comprising the pixel circuit of poly-Si, while fabricating other transistors of the circuit of a-Si, transistor size may be reduced while also maintaining an acceptable gain and other properties of the circuit. (As used herein, a device having a least one layer formed of polycrystalline silicon will be referred to herein as a poly-Si device, such as a poly-Si TFT.) A circuit containing both poly-Si and a-Si devices according to the present invention is referred to herein as a hybrid circuit.

According to one embodiment of the present invention, a bias line and a data line are connected via first and second thin film transistors (TFTs). The gate of the first TFT is connected to a reverse biased photosensor in such a way that the conductivity of the first TFT is a function of the charge state of the photosensor. The first TFT is referred to as an amplifier transistor. The gate of the second TFT is connected to a gate line such that the conductivity of the second TFT is a function of the voltage on the gate line. The second TFT is referred to as a pass transistor. A third TFT is connected to the photosensor such that the conductivity of the third TFT is capable of resetting the photosensor. The third TFT is referred to as a reset transistor.

It is known that an a-Si TFT has a lower off state current than an equivalent polycrystalline silicon (poly-Si) TFT. This is important where there is a desire to minimize leakage current, for example in the reset transistor. Conversely, a poly-Si TFT provides improved carrier mobility as compared to an equivalent a-Si TFT. This is important, for example, where gain through a transistor is a concern, such as in the pass and amplifier TFTs. Thus, a hybrid circuit is employed to take advantage of the two different types of TFTs.

The pass and amplifier TFTs may be fabricated to be poly-Si to also allow a reduction in their channel sizes while maintaining acceptable gain. They may conveniently be formed by recrystallizing a-Si, but other processes may be used.

The reset TFT may be fabricated to be a-Si since the low off-state current afforded by a-Si TFTs minimizes leakage from the photosensor between resets. As leakage current is assumed to vary from pixel to pixel in the array, regardless of the type (a-Si or poly-Si) of reset transistor employed, the a-Si reset TFT will also reduce the variation in leakage levels from pixel to pixel (referred to as fixed pattern noise). This advantage provided by the a-Si reset transistor is difficult to match by software or other external devices, since fixed pattern noise depends in part on the charge signal on the sensor, and thus will vary from pixel to pixel.

One embodiment disclosed herein for producing the hybrid circuit is a process referred to as recrystallization. According to this recrystallization process, regions of a-Si are dehydrogenated, partly melted, and crystallized upon resolidification. A laser beam at various energies may perform the dehydrogenation and melting. An optical mask may be used to limit the areas exposed to the laser beam. A plasma hydrogenation process may be employed to compensate for the dehydrogenation caused by the laser crystallization.

Special circuitry may be provided for synchronizing gate and drive line voltages to further reduce leakage current. Special circuitry may also be employed to obtain a more linear circuit output. Also, one variation of the circuit disclosed herein may be used for single event detection, such as peak detection for x-ray scattering and the like.

Thus, the present invention and its various embodiments provide numerous advantages including, but not limited to, reduced pixel area consumed by pixel circuitry, improved pixel amplifier gain, improved sensor fill factor, reduced sensor level loss, reduced fixed pattern noise, improved signal to noise ratio, etc., as will be described in further detail below.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described, such as transistor channel length and width, material deposition parameters, device performance characteristics, etc. These recited ranges are to be treated as examples only, and are not intended to limit the scope of the claims hereof. In addition, a number of materials are identified as suitable for various facets of the embodiments, such as for substrates, metal interconnections, etc. These recited materials are also to be treated as exemplary, and are not intended to limit the scope of the claims hereof.

The crystalline state of devices described below (e.g., noncrystalline or amorphous, polycrystalline, etc.) is referred to as the structural state. A converted first structural state is a structural state different from a first structural state brought about by converting the first structural state. For example, a first structural state may be amorphous, and a converted first structural state may by polycrystalline, converted from amorphous by a thermal process. As another example, the first structural state may be polycrystalline, and a converted first structural state may be amorphous converted from polycrystalline by implantation.

Basic Hybrid Pixel Amplifier Circuit

Figure 1:
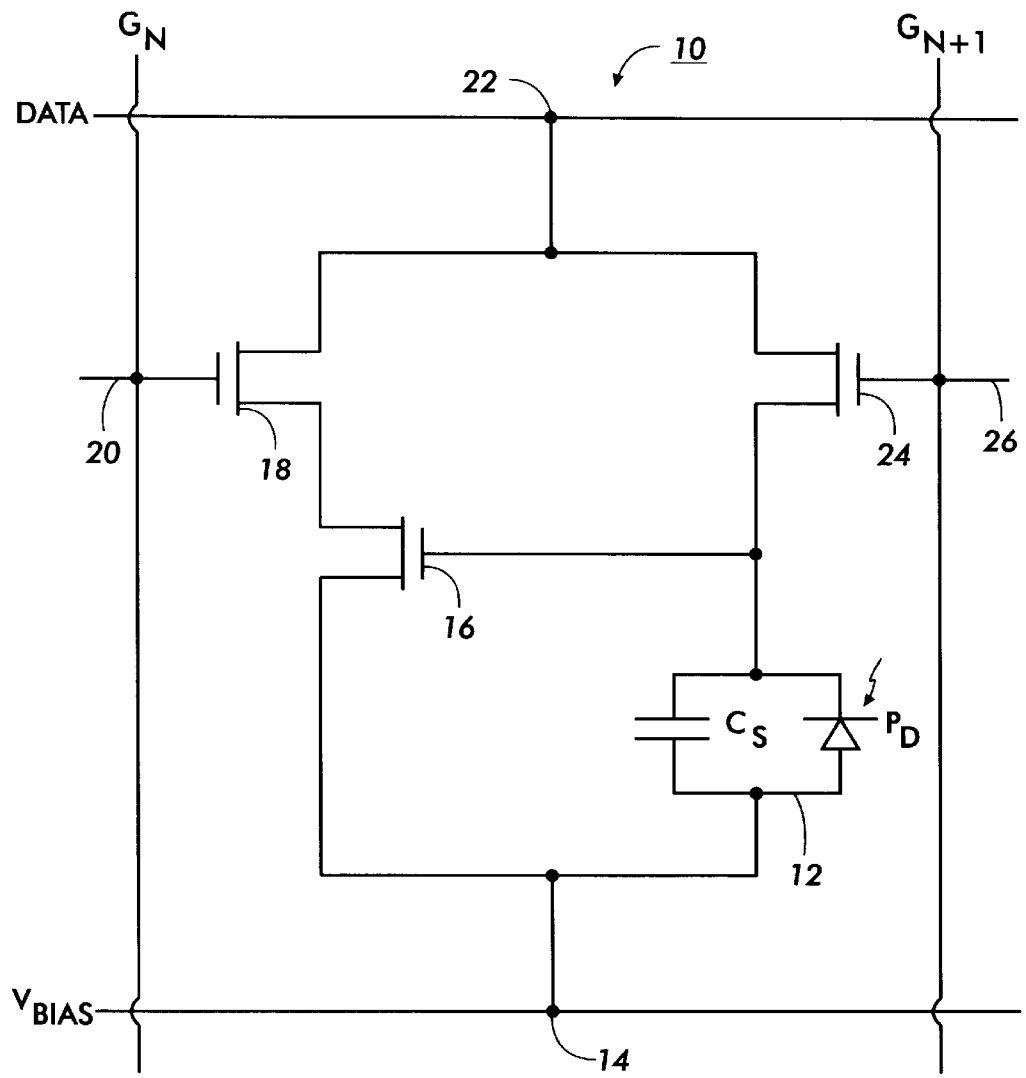
FIG. 1 is a schematic illustration of a circuit according to one embodiment of the present invention.

One embodiment of a hybrid pixel circuit 10 according to the present invention is shown in FIG. 1. Circuit 10 consists of a two-terminal photosensor 12 (e.g., a photodiode) which has an inherent capacitance $C_s$, which stores a charge under reverse bias. Photosensor 12 is connected in reverse bias mode between a data terminal 22, which may be connected to a data line (Data), and a bias voltage terminal 14, which may be connected to a bias line ($V_{Bias}$), at for example a bias voltage of −5 volts. The source of a first transistor 16, which is referred to herein as an amplifier transistor, is also connected to the bias voltage terminal 14. The gate of amplifier transistor 16 is connected to a first terminal of photosensor 12. The drain of amplifier transistor 16 is also connected to the source of a second transistor 18 which is referred to herein as a pass transistor. The gate of pass transistor 18 is connected to a gate terminal 20, which may for example be connected to a gate line ($G_n$), and the drain of pass transistor 18 is connected to data terminal 22. The source of a third transistor 24, referred to herein as a reset transistor, is connected to the first terminal of photosensor 12. The gate of reset transistor 24 is connected to a gate terminal 26, which may for example be connected to a gate line ($G_{n+1}$). The drain of third transistor 24 is connected to data terminal 22.

Photosensor 12 may be an n-i-p amorphous silicon photosensor, where "n" refers to an n-doped layer and "p" refers to a p-doped layer, with each layer on the order of 10 to 100 nanometers (nm) thick. The "i" refers to intrinsic or undoped amorphous silicon material on the order of one to two microns ($\mu$m) thick. In reverse bias mode, the p-doped region of photosensor 12 will be connected to bias voltage terminal 14. Other types of sensors, such as selenium or lead iodide, in the case of an x-ray image apparatus, may alternatively be employed. It should also be appreciated that sensors other than photosensors may be employed. For example, temperature sensors, chemical sensors, and the like are well known in the art. Thus, as used herein, "sensor" means a device whose electrical charge state (e.g., the level of charge stored therein) is a function of the presence or absence of a selected quantity being sensed. This general class of sensors is within the scope of this disclosure.

Circuit 10 operates as follows. An initial charge is established by turning on, then off, the reset TFT. Light incident on photosensor 12 results in a partial discharge of the pixel capacitor; the amount of discharge being proportional to the amount of light incident upon photosensor 12. The charge then stored in photosensor 12 is applied to the gate of the amplifier transistor 16, which determines the current between the source and drain of amplifier transistor 16. When gate line $G_n$ is selected (that is, when a voltage is applied thereto), a voltage is applied to the gate of pass transistor 18, rendering it conductive between its source and drain. With both the amplifier and pass transistors 16 and 18 conductive, a voltage from the bias line is applied to data terminal 22, which may be sensed by circuitry monitoring the data line. This structure is referred to as an amplified pixel.

In an amplified pixel, the level of current applied to data terminal 22 is thus a function of the charge on photosensor 12. For this process to yield accurate results, however, the charge stored by photosensor 12 must be reset prior to the sensing/readout cycle. This is the function of reset transistor 24. By connecting the gate of reset transistor 24 to gate line $G_{n+1}$, during the readout cycle of the next pixel, reset transistor 24 is made conductive between source and drain. This allows a recharging of the current in photosensor 12. The pixel is thereby "reset" and ready for the next sensing/read out cycle.

According to the present invention, amplifier and pass transistors 16 and 18 are advantageously formed of poly-Si, thus optimizing gain from the circuit. Reset transistor 24 is advantageously formed of a-Si, thus minimizing leakage current from the photosensor 12.

Figure 2:
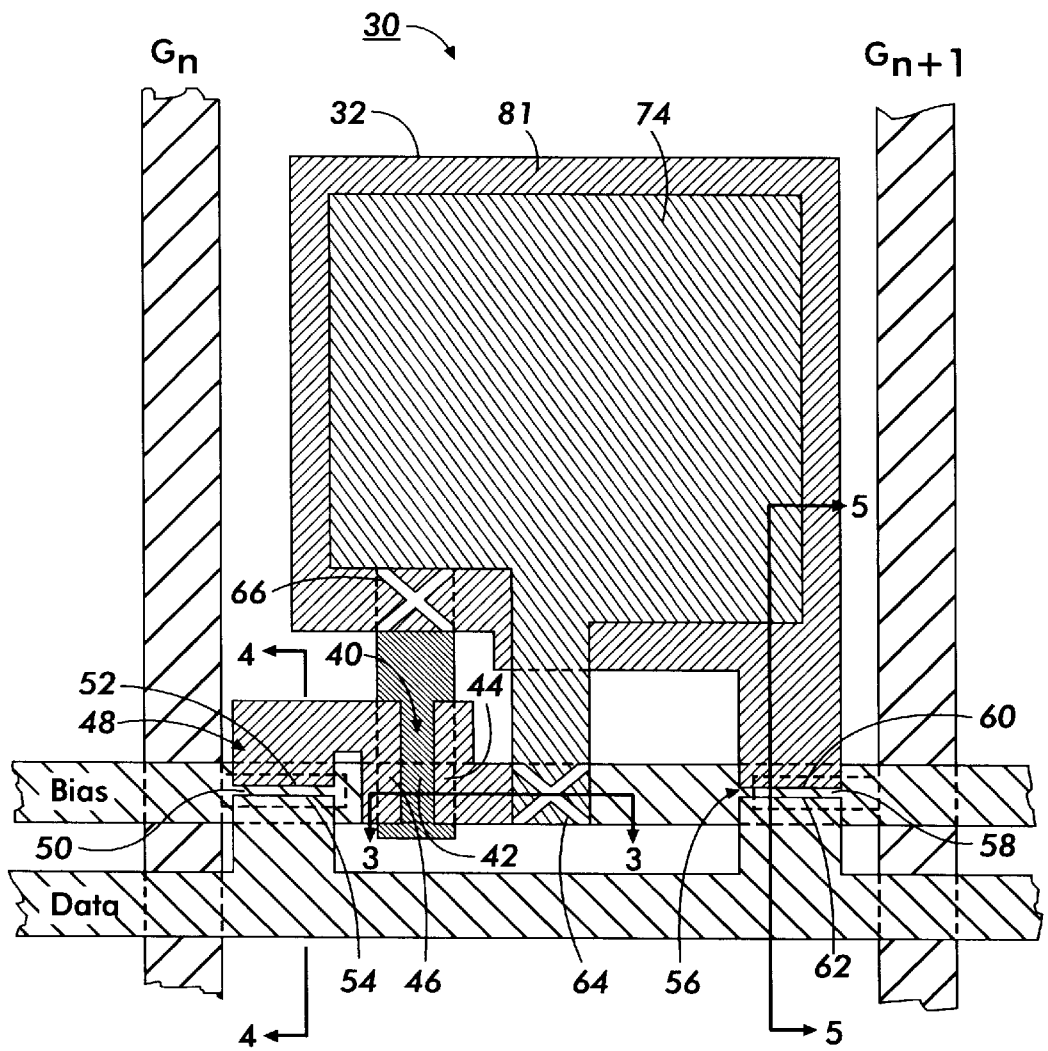
FIG. 2 is a plan view of one embodiment of the present invention, showing various layers of the embodiment.

Shown in plan view in FIG. 2 is one embodiment of the present invention. In the view of FIG. 2 (and other views presented herein), several layers have not been shown to allow for a more clear illustration of the present invention. Those layers not shown, such as insulation, contact, phosphor or scintillation layer, and the like are well known to those skilled in the art, but will be described as they pertain to the present invention. According to the embodiment shown in FIG. 2, a circuit 30 forms one cell in an array of cells designed for image sensing. In the coordinate system of FIG. 2, circuit 30 is bordered to its left by gate line $G_n$ and to its right by gate line $G_{n+1}$. The pitch of the cells in such an array is, for example, between 100 and 500 $\mu$m.

At its bottom edge, circuit 30 is bordered by a bias line labeled Bias and a data line labeled Data. Circuit 30 consists of a photosensor 32, with an upper sensor contact 74 and a lower sensor contact 81, shown in cross section and described further below with regard to FIG. 5.

Figure 3:
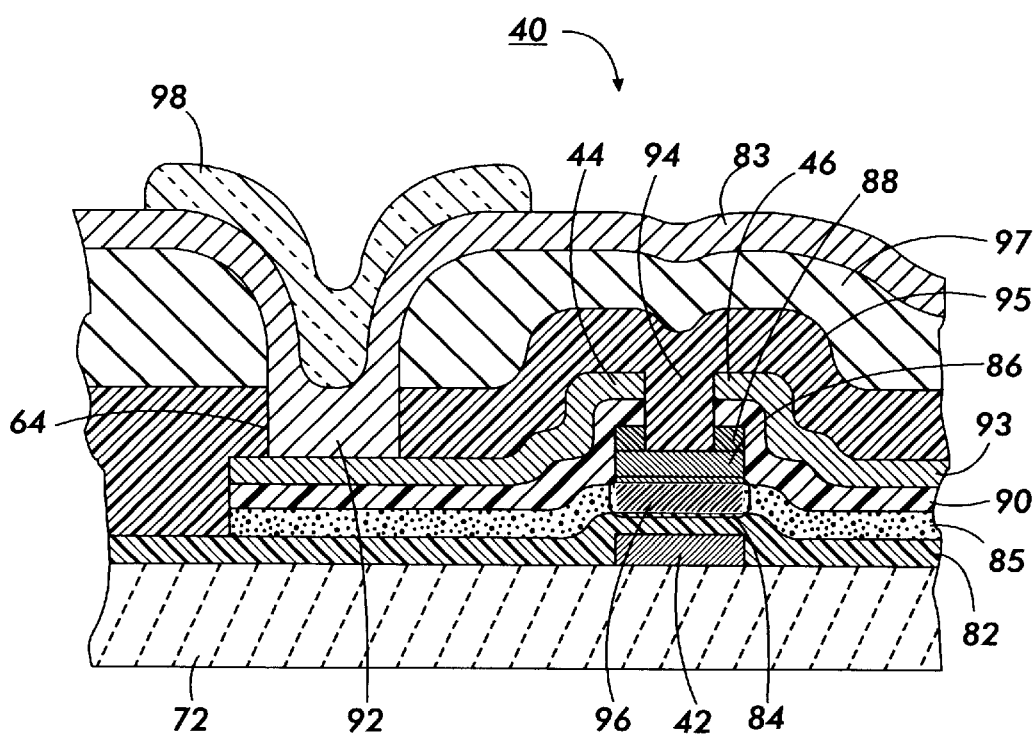
FIG. 3 is a cross-section, cut-away view of a portion of the embodiment shown in FIG. 2 labeled F3—F3.

A first transistor (amplifier transistor) 40 is formed having a gate contact 42, a source contact 44, and a drain contact 46 in various layers as shown and described further with regard to FIG. 3. A first via 64 is formed to allow electrical interconnection between source contact 44, the bias line, and the upper sensor contact 74. A second via 66 is formed to allow electrical interconnection between gate contact 42 and lower sensor contact 81.

Figure 4:
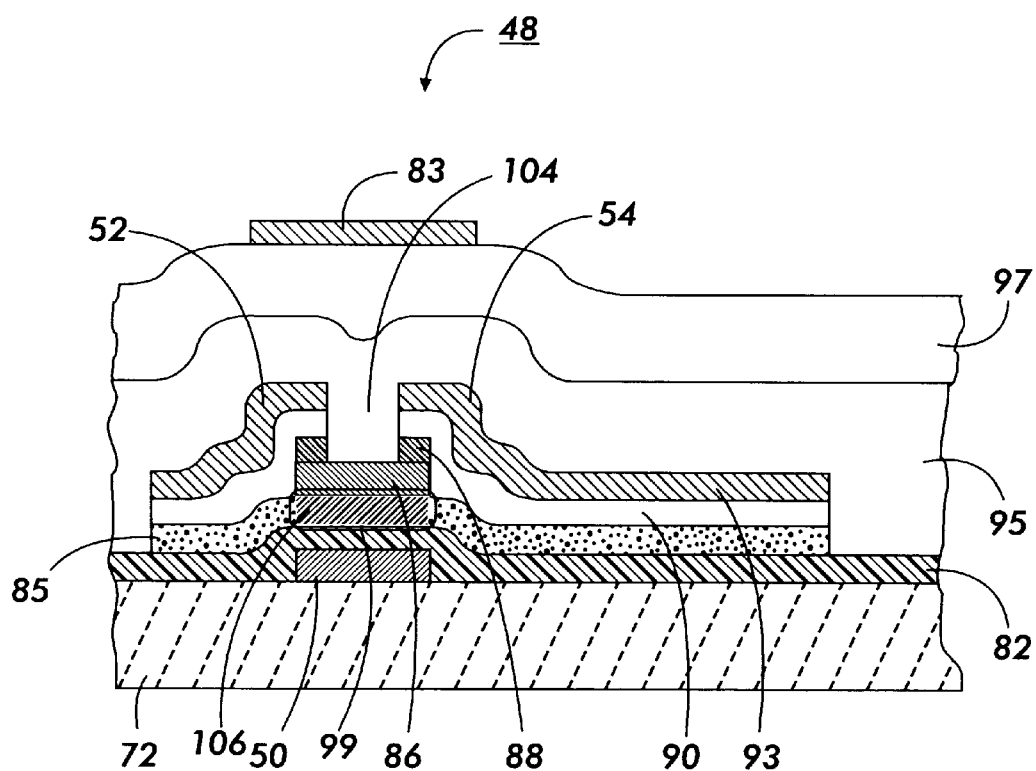
FIG. 4 is a cross-section, cut-away view of a portion of the embodiment shown in FIG. 2 labeled F4—F4.

A second transistor (pass transistor) 48 is formed having a gate contact 50, a source contact 52, and a drain contact 54 in various layers as shown and described further with regard to FIG. 4. A third transistor (reset transistor) 56 is formed having a gate contact 58, a source contact 60, and a drain contact 62 in various layers as shown and described further with regard to FIG. 5.

With reference now to FIG. 3, there is shown therein a portion of the circuit 30 in cross section, seen in the direction of the arrows F3—F3 in FIG. 2. The substrate 72 on which the circuit may be formed may be ceramic, glass, or other material known in the art. Formed first on substrate 72 is gate metal 42. Gate metal 42 forms the gate electrode of first transistor 40. Over gate metal 42 is formed an insulation layer 82, which may be a single layer of material such as SiN, or be comprised of multiple sublayers, for example SiN and SiO$_2$ as taught by U.S. patent application Ser. No. 08/096,313, which is incorporated herein by reference.

Channel layer 85 is next deposited over insulation layer 82. Channel layer 85 is initially composed of a-Si but the region 84 of amplifier transistor 40 will undergo a crystallization process described further below. Following crystallization, oxide dielectric layer 86 is next applied over the structure. An absorption layer 88 is next applied above oxide dielectric layer 86. The role of absorption layer 88 is to compensate for the different transparencies between aSi and poly-Si during a subsequent backside lithography step described below. Absorption layer 88 may be formed of a-Si, or other suitable material. A more complete discussion of the method of using the absorption layer, and the structures resulting therefrom, may be found in U.S. patent applications aa/aaa,aaa, bb/bbb,bbb, and cc/ccc,ccc (attorney docket numbers D/98004, D/98004Q, and D/98004Q1, respectively), each of which being incorporated herein by reference. At this point, backside lithography may be employed to define oxide dielectric layer 86, using the gate electrode 42 as a mask. Thus, the width of the oxide dielectric layer 86 is roughly the same as the width of the gate electrode 42.

Next formed is electrode layer 90, which may be comprised of, for example, n+ doped a-Si. A metal contact layer 93 is next formed over electrode layer 90. A gap 94 is formed dividing at least the absorption layer 88, electrode layer 90, and metal contact layer 93 in the region of amplifier transistor 40 into electrically isolated first and second regions, with a conduction path therebetween through channel layer 85. Source contact 44 and drain contact 46 are thus formed. A transistor channel 96 may then be formed in the channel layer 85 during operation of the transistor 40. In the present case, transistor 40 is a thin film transistor having a poly-Si channel layer (and is therefore referred to as a poly-Si TFT).

A first passivation layer 95 is next formed, and second passivation layer 97 formed thereover. At this point, via 64 may be formed in the passivation layers 95 and 97. Bias line metal 83 is next applied (so as to fully overlay gate metal 42 in order to shield the electrode from illumination). A portion 92 of bias metal 83 located in via 64 forms an electrically conductive connection with metal contact layer 93. A transparent conductive layer 98, such as indium tin oxide (ITO) is next formed, such that is in electrical communication with bias metal 83.

While not shown in cross section, via 66 is also formed to make electrical connection between lower sensor contact 81 and gate metal 42. Upper sensor contact 74 is connected to the bias line at via 64.

With reference now to FIG. 4, there is shown in cross section a portion of circuit 30 seen in the direction of the arrows F4—F4 of FIG. 2. Formed on substrate 72 is gate metal 50, which forms the gate electrode of pass transistor 48. Gate metal 50 may be formed in a common series of steps with gate metal 42, patterned to form appropriately sized and located structures. Over gate metal 50 is formed insulation layer 82. Channel layer 85 is formed over insulation layer 82. Again, channel layer 85 is initially composed of a-Si but, in the region 99 of pass transistor 48, it will undergo a crystallization process described further below.

Dielectric layer 86 and absorption layer 88 are the next layers of the structure. Electrode layer 90 lies thereover, and contact metal layer 93 overlies electrode layer 90.

Gap 104 divides at least the absorption layer 88, electrode layer 90, and contact metal layer 93 in the region of pass transistor 48 into electrically isolated first and second regions, with a conduction path therebetween through channel layer 85. Source contact 52 and drain contact 54 are thus formed. A transistor channel 106 may then be formed in the channel layer 85 during operation of the transistor 48. First and second passivation layers 95, 97 are the next layers, and bias metal 83 is located atop second passivation layer 97. In the present case, transistor 48 is a thin film transistor having a poly-Si channel layer (and is therefore referred to as a poly-Si TFT).

Figure 5:
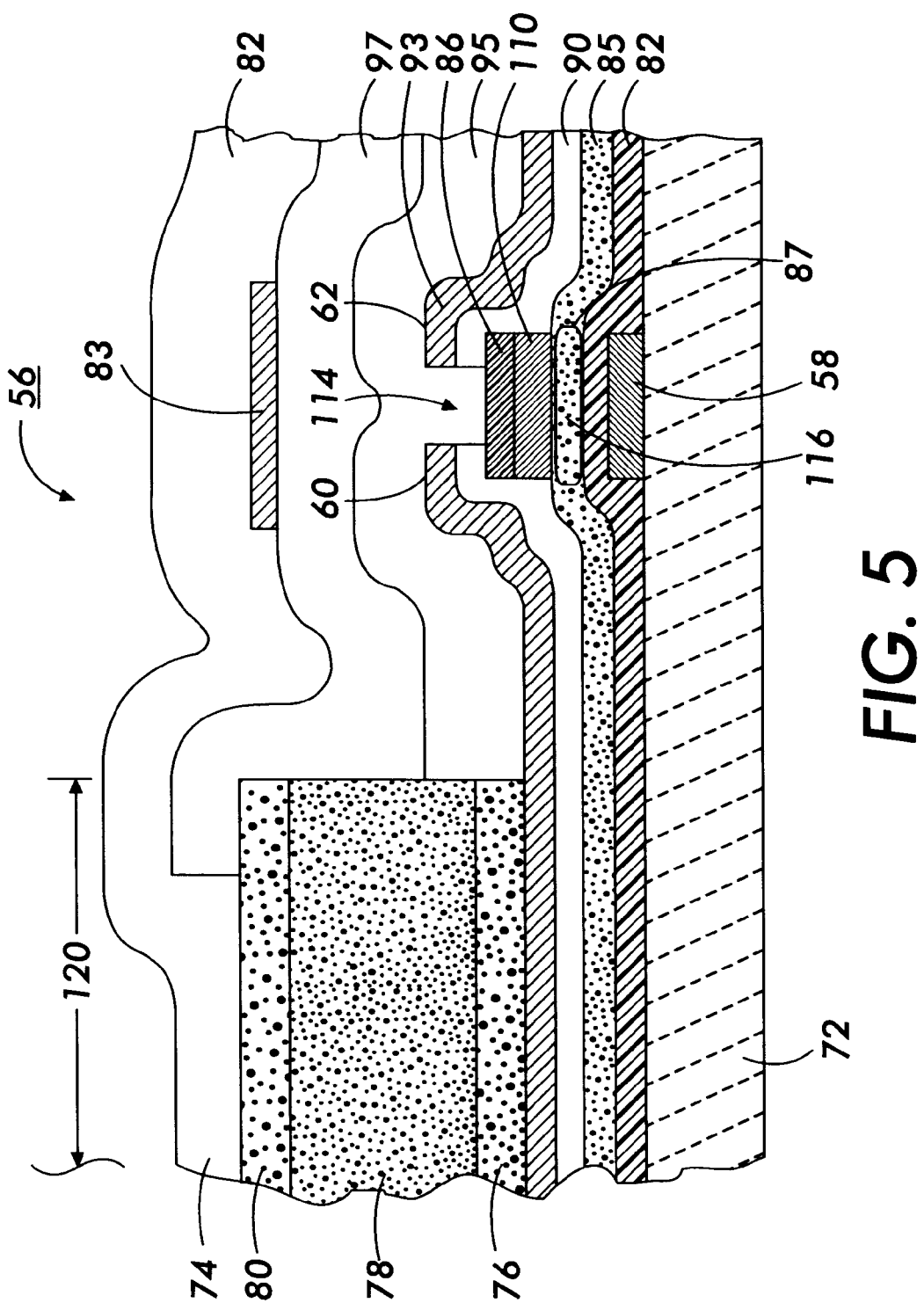
FIG. 5 is a cross-section, cut-away view of a portion of the embodiment shown in FIG. 2 labeled F5—F5.

With reference to FIG. 5, there is shown therein a portion of circuit 30 seen in the direction of arrows F5—F5 of FIG. 2. Formed on substrate 72 is gate metal 58, which forms the gate electrode of reset transistor 56. Over gate metal 58 is insulation layer 82. The next layer is channel layer 85. Again, channel layer 85 is deposited as a-Si. However, unlike the channel layer in the regions 84 and 99 of transistors 40 and 48, respectively, the region 87 of the channel layer in the region of transistor 56 is not crystallized, but instead remains a-Si.

Nitride dielectric layer 110 is the next layer in the structure. Since the region 87 of channel layer 85 is a-Si, a nitride is better suited for the interface layer than the oxide used over the poly-Si channel regions of transistors 40 and 48. The aforementioned oxide dielectric layer 86 is the next layer.

No absorption layer 88 is employed in the region of transistor 56 (in contrast to transistors 40 and 48). That is because a-Si, such as that comprising region 87 of the channel layer 85, is less transparent than poly-Si, such as that comprising regions 84 and 99 of the channel layer 85. Since the absorption layer 88 is used to compensate for the difference in transparency, it is not needed in region 87 of transistor 56.

Electrode layer 90 is the next layer of the structure, and contact metal layer 93 overlays electrode layer 90. A gap 114 divides at least the electrode layer 90 and contact metal layer 93 in the region of reset transistor 56 into electrically isolated first and second regions, with a conduction path therebetween through channel layer 85. Source contact 60 and drain contact 62 are thus formed. A channel 116 may then be formed in the channel layer 85 during operation of the transistor 56. In the present case, transistor 56 is a thin film transistor having an a-Si channel layer (and is therefore referred to as an a-Si TFT).

First passivation layer 95 is the next layer in the structure. An opening is defined in region 120 of the structure thus formed, exposing a portion of metal contact layer 93. Formed over and in electrical communication with metal contact layer 93 is n+ doped a-Si layer 76, which may for example be on the order of several hundred angstroms (Å) thick. Above layer 76 is an intrinsic a-Si layer 78 which may be on the order of 0.1 microns or thicker. Above layer 78 is an p+ doped a-Si layer 80 which may be on the order of several hundred angstroms thick. Formed next is second passivation layer 97, and an opening formed therein to expose a region of p+ doped a-Si layer 80. Bias line metal 83 is the next component of the structure, and overlies second passivation layer 97. Upper sensor contact 74, made of a light transparent, conductive material such as indium tin oxide (ITO) next covers the structure such that bias line metal 83 and p+ doped a-Si layer 80 are in electrical communication with one another. A scintillation layer (not shown) may be disposed above upper contact 74 to assist in the detection of certain types of radiation such as x-ray, etc.

As mentioned above, the channel layer 85 in the region of amplifier transistor 40 and pass transistor 48 (regions 84 and 99) is selectively converted from a-Si to poly-Si. That is, regions 84 and 99 start off in a first structural state (e.g., amorphous) and through an appropriate process end in a converted first structural state (e.g., polycrystalline). A process for accomplishing this conversion, and resulting structures, are each described in the aforementioned and incorporated U.S. patent applications aa/aaa,aaa, bb/bbb, bbb, and cc/ccc,ccc (attorney docket numbers D/98004, D/98004Q, and D/98004Q1, respectively). These incorporated references describe methods for obtaining structures, and the resulting structures having an a-Si and a poly-Si device formed on a shared substrate and located close to one another.

An exemplary process of selective silicon crystallization starts following the deposition of the a-Si layer over a dielectric layer. A nitride layer is first deposited, then removed except over regions of the channel layer which are to remain a-Si. Next, an oxide insulation layer is deposited. The aforementioned a-Si absorption layer is applied over the oxide layer, over regions of the channel layer which are to be crystallized. The thickness of this a-Si compensation layer is selected to optimize absorption of the ultra violet (UV) radiation used in a backside lithography process employed to form a conductive region, such as a channel, of the device being fabricated. The back-side lithography is then performed, and a doped or intrinsic silicon layer is applied over the structure. If the silicon is intrinsic, doping is then performed to obtain the desired structure. Gaps and contact metal are then formed to complete the device.

In addition, prior to crystallization, a layer of blocking material such as titanium tungsten (TiW) alloy is formed over the region in which channel layer is to remain a-Si. This TiW layer, together with the nitride layer, serves as an optical mask to protect the region from laser crystallization. Following the laser crystallization, the TiW layer is removed.

The structure is also rehydrogenated to compensate for the dehydrogenation during the laser crystallization. The nitride layer over the region which is to become the a-Si device serves to protect the a-Si layer from the hydrogenation process. Processing then continues as previously described.

Thus, with reference again to FIG. 1, amplifier transistor 16 and pass transistor 18 will be poly-Si TFTs, thus taking advantage of the higher mobility (and thus improved transconductance and gain) of poly-Si over a-Si, while reset transistor 24 will be an a-Si TFT, thus taking advantage of the low off-state (hence leakage) current of a-Si. In an array of such circuits, the overall lower leakage current from the a-Si reset TFTs (as compared to poly-Si TFTs) keeps to a minimum the fixed pattern noise.

Figure 6:
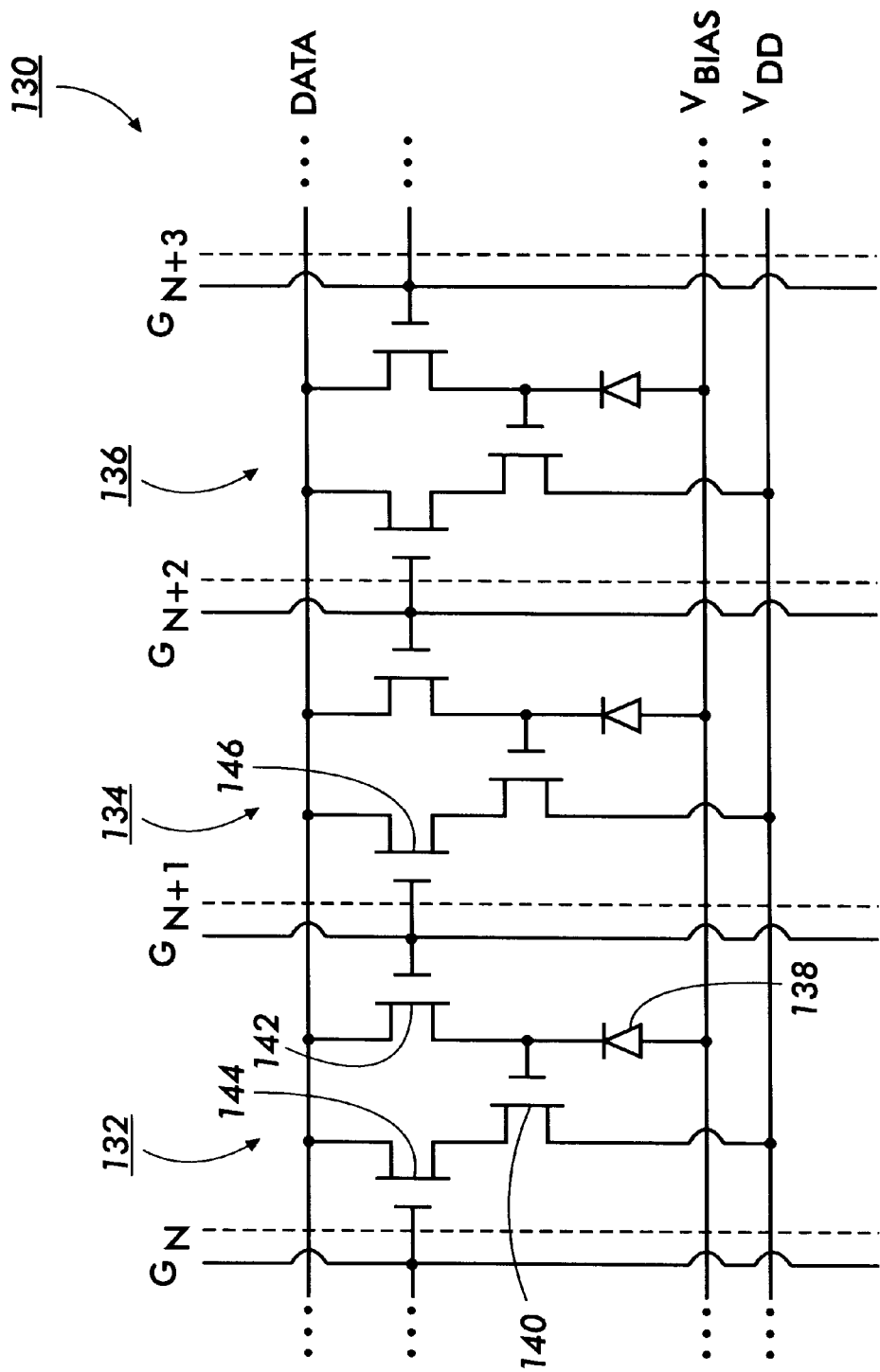
FIG. 6 is a schematic illustration of a portion of an array according to one embodiment of the present invention.

Shown in FIG. 6 is a portion of an array 130 employing circuits of the type described above, according to one embodiment of the present invention. Array 130 consists of a number of circuits, each comprising a pixel 132, 134, 136, etc. Pixel 132 is representative of each of the pixels in array 130. Pixel 132 consists of photosensor 138 connected to a bias line $V_{bias}$, which may be held at, for example, −5 volts. Photosensor 138 is also connected to the gate of poly-Si amplifier transistor 140, and the source of a-Si reset transistor 142. The source of poly-Si amplifier transistor 140 is connected to a drive line $V_{DD}$, which may be held at, for example, −10 volts. The drain of poly-Si amplifier transistor 140 is connected to the source of poly-Si pass transistor 144. The drains of a-Si reset transistor 142 and poly-Si pass transistor 144 are connected to a data line labeled Data. The gate of poly-Si pass transistor 144 is connected to a gate line labeled $G_n$. The gate of a-Si reset transistor 142 is connected to a gate line labeled $G_{n+1}$.

Figure 7:
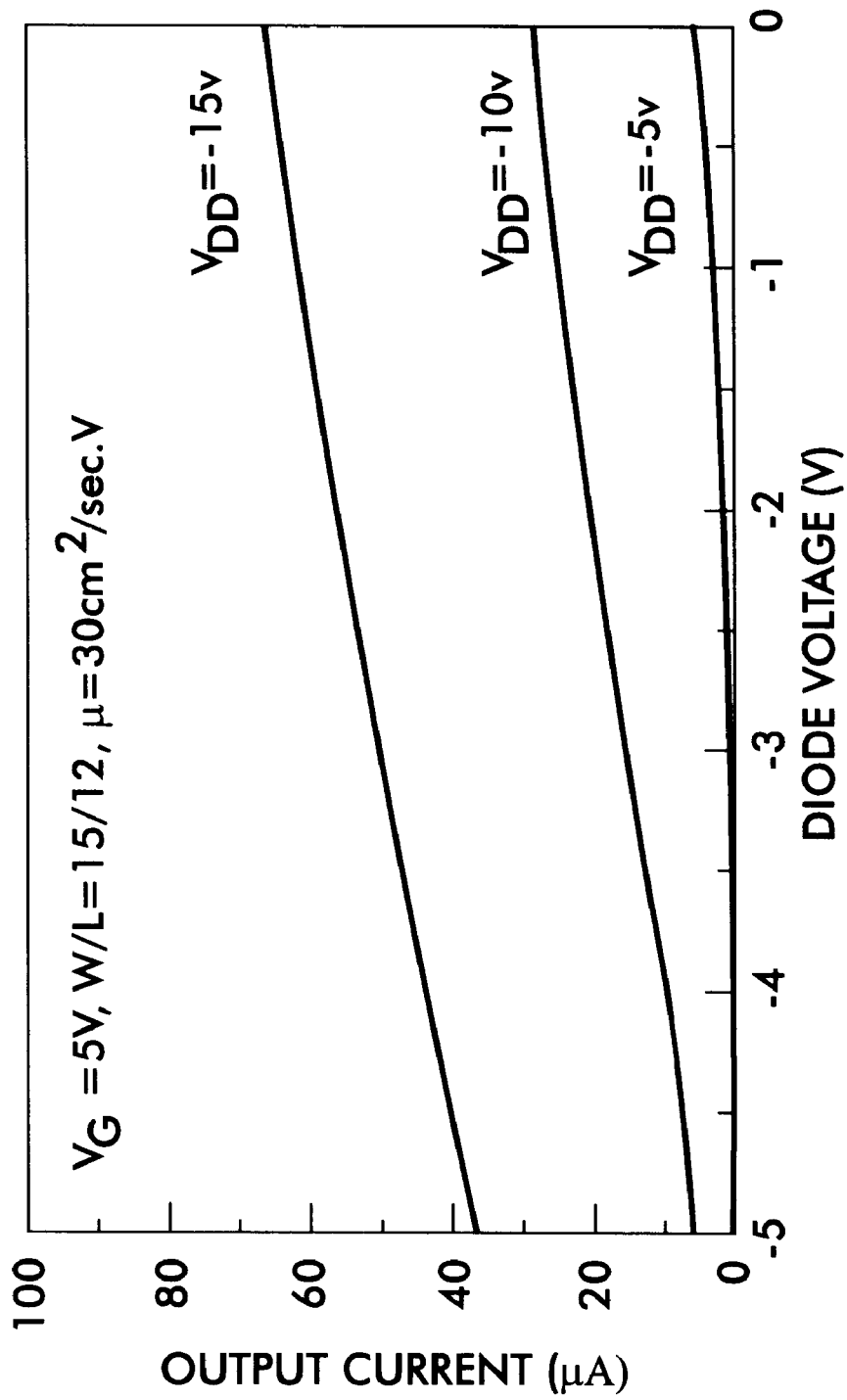
FIG. 7 is a plot of voltage versus current for a TFT, illustrating the linearity of driving the TFT at $V_{DD}$ of −10 volts.

The circuits of pixels 132, 134, 136, etc. of array 130 differ from circuit 10 shown in FIG. 1 in that separate lines $V_{bias}$ and $V_{DD}$ are employed. The number of lines per pixel could be reduced by sharing a single line between the functions of $V_{bias}$ and $V_{DD}$ as shown in FIG. 1. However, while −5 volts may be an optimal bias for the photosensor 138, a lower voltage provides better linearity for the poly-Si amplifier transistor 140 shown in FIG. 6. Thus, a separate $V_{DD}$ at, e.g., −10 volts may be employed. Shown in FIG. 7 is a simulation of an amplifier transistor with dimensions of W=15 μm and L=12 μm. With $V_{DD}$ set at −10 volts, both current gain and linearity are improved compared to a $V_{DD}$ of −5 volts.

The effective charge gain is estimated as follows. The maximum current change between 0 and −5 volts on the photosensor 138 is about 20 μA. To make a fair comparison, the readout time should be 5RC, which is the readout time for a conventional pixel, where R is the on-resistance for an a-Si TFT and C is the sensor capacitance. Using typical values of R for an a-Si TFT at 1 MΩ and C at 1 pF, the readout time is about 5*(1 MΩ)*(1 pF), or 5 μsec. The integrated charge readout during this time is, using a pixel amplifier:

Q=I·Δt=(20 μA)·(5 μsec)=100 pC. The maximum charge on the sensor is:

Q=C·V=(1 pF)·(5V)=5pC. Therefore, the effective charge gain is 20, which represents a significant improvement in signal-to-noise ratio as compared to a gain of 1 for a simple pixel circuit. In practice, the gain of the array can be adjusted, by varying the readout time, according to each individual image light intensity, providing a proper imaging dynamic range in an adaptive manner.

Figure 8:
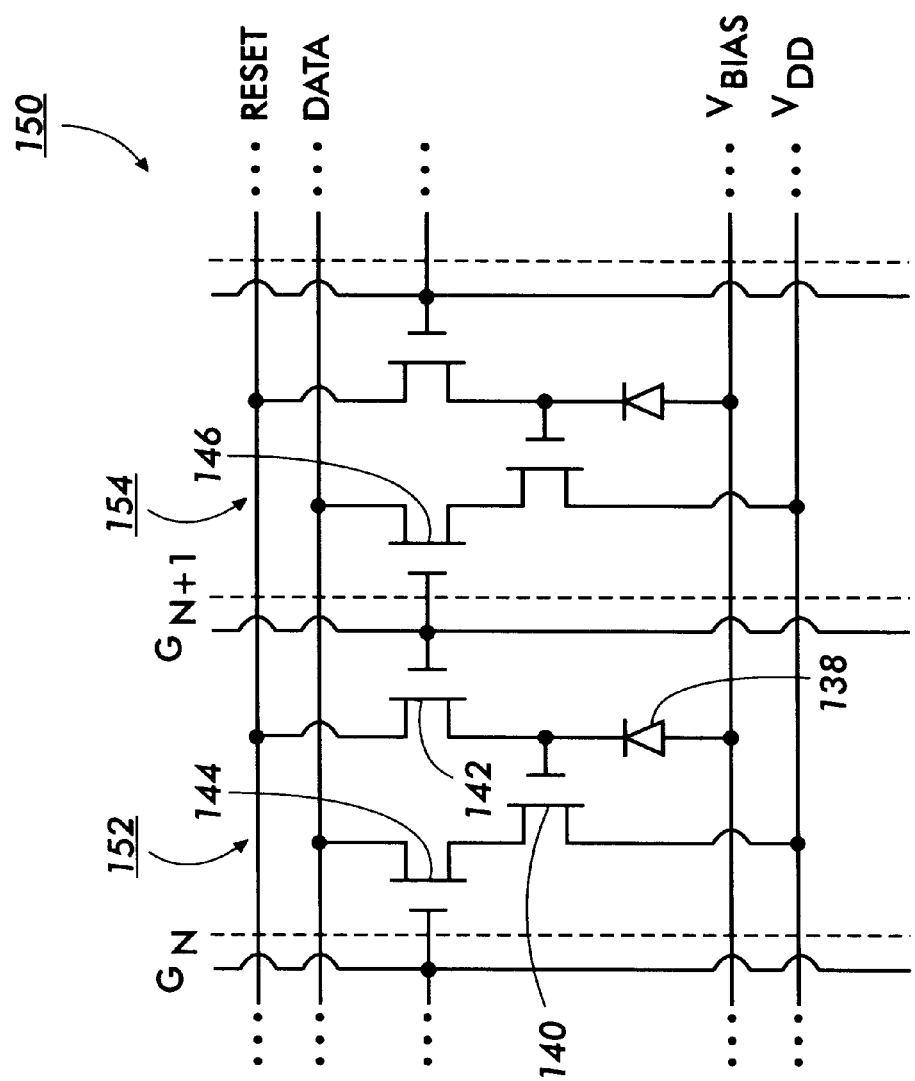
FIG. 8 is a schematic illustration of a portion of an array according to another embodiment of the present invention.

Shown in FIG. 8 is an array 150 according to another embodiment of the present invention. Array 150 consists of a number of circuits, each comprising a pixel 152, 154, etc. The circuits are essentially the same as those described above with regard to FIG. 6, with the following difference. While in the array 130 of FIG. 6, the reset transistor 142 and the pass transistor 144 of each pixel was connected to a common data line, the array 150 of FIG. 8 has the reset transistor 142 of each pixel connected to a reset line separate from the data line to which the pass transistor 144 of each pixel is connected.

Pixel Circuit For Synchronizing Gate And Drive Lines

Figure 9:
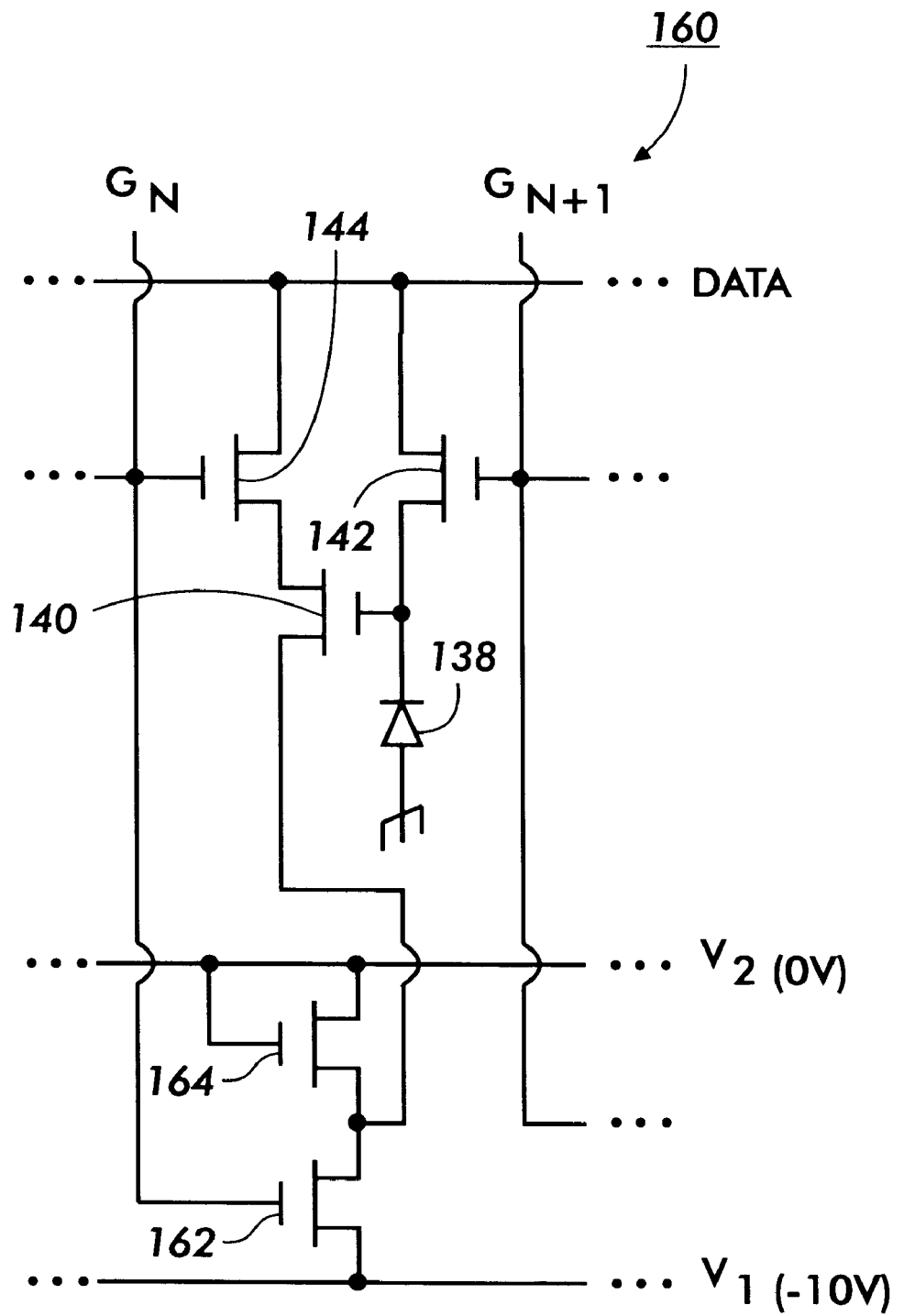
FIG. 9 is a circuit according to an embodiment of the present invention which provides reduced leakage current by synchronizing the gate voltage and a drive voltage.

By synchronizing the voltage of the drive line with the gate line (that is, applying a drive voltage only at a time when the gate line enables the pixel circuit to read data onto the data line), the effects of any leakage of the amplifier transistor (and pass transistor) may be minimized. While there are many circuit arrangements for accomplishing this synchronization, each of which being within the scope of the present disclosure, shown in FIG. 9 is one example of a pixel circuit 160 including a bias circuit at the pixel level for synchronization of the drive voltage and a gate line voltage $V_G$. While the basic circuit is similar to that previously described, two lines $V_1$ and $V_2$ replace the previously described $V_{DD}$ line. A first synchronizing transistor 162 is connected such that its source is connected to $V_1$. The gate of first synchronizing transistor 162 is connected to a gate line, such as $G_n$. Its drain is connected to the source of a second synchronizing transistor 164. The gate and drain of second synchronizing transistor 164 are connected to $V_2$. Transistors 162 and 164 are each TFTs, with conductive channel layers most conveniently formed of poly-Si. Line $V_2$ is held at 0 volts and line $V_1$ is held at −10 volts, for example.

Figure 10:
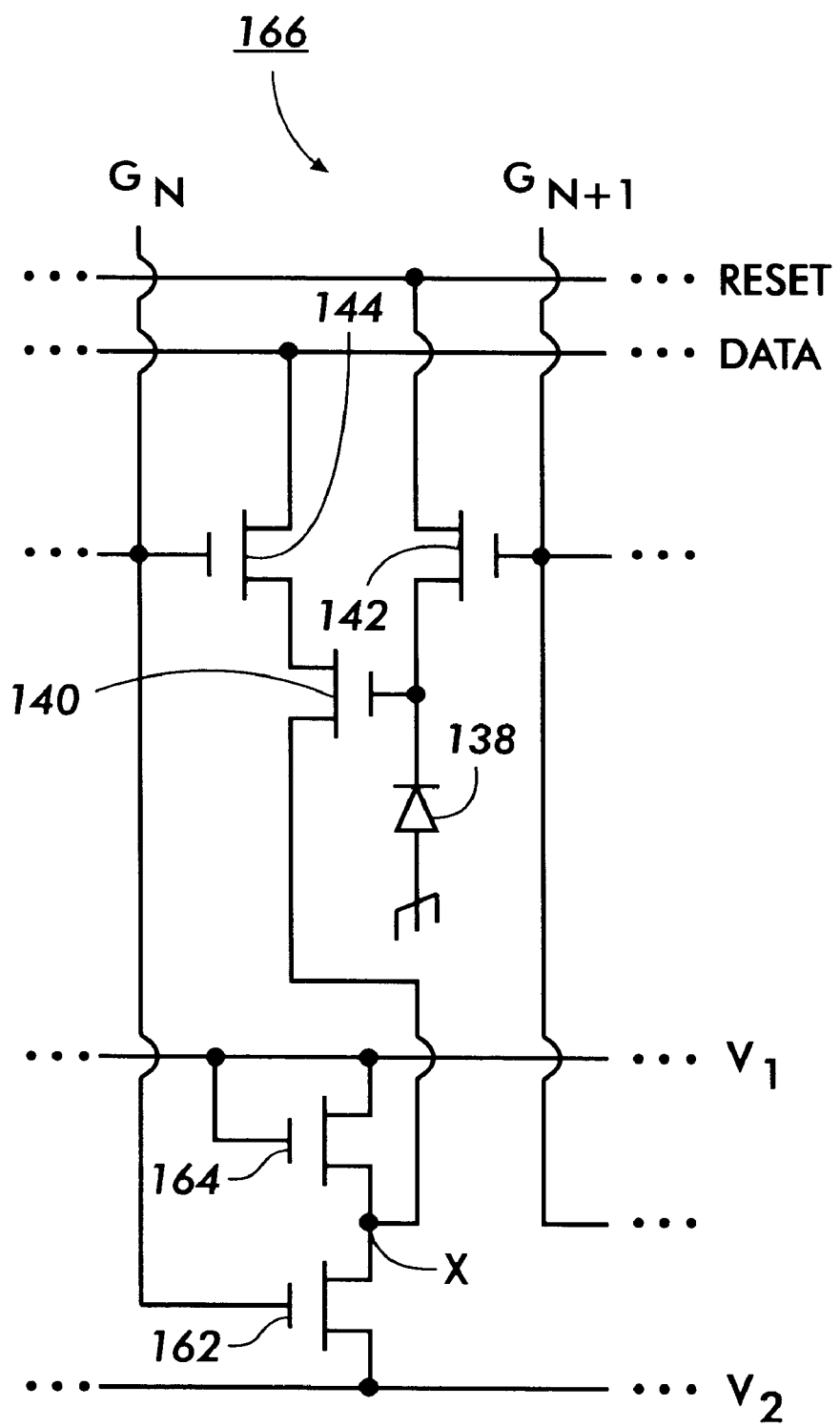
FIG. 10 shows another embodiment of the present invention which provides separate data lines and reset lines.

FIG. 10 illustrates a circuit 166 which is a variation of the embodiment of the embodiment shown in FIG. 9. As shown in FIG. 10, the charge for resetting the photosensor 138 is obtained on a reset line labeled Reset, as opposed to using the data line for this purpose.

In operation, when a voltage is applied to $G_n$ the pass transistor 144 is on so the data in the pixel may be read out. At the same time, transistor 162 is conductive, which brings the voltage at node X to a voltage level close to $V_2$. This is voltage drives the amplifier transistor 140. When a low voltage is applied to $G_n$ pass transistor 144 is off. At the same time, transistor 162 is resistive, which brings the voltage at node X closer to $V_1$. Under these conditions, the voltage difference between the source and drain of pass transistor 144 is small. Therefore, the leakage current through pass transistor 144 is small.

Figure 11:
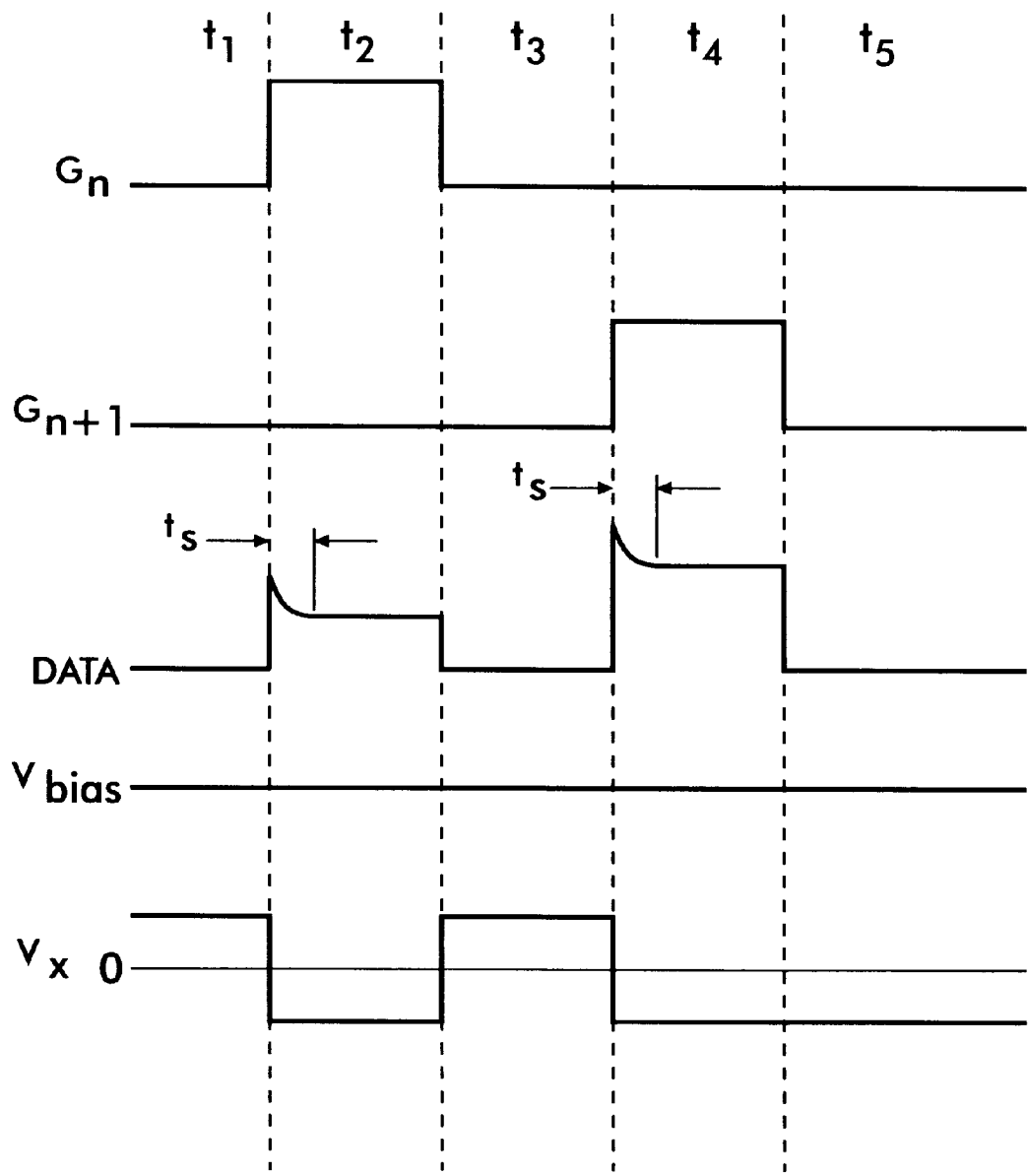
FIG. 11 is a timing chart showing the state of certain lines at various times in a circuit according to one embodiment of the present invention.
Figure 12:
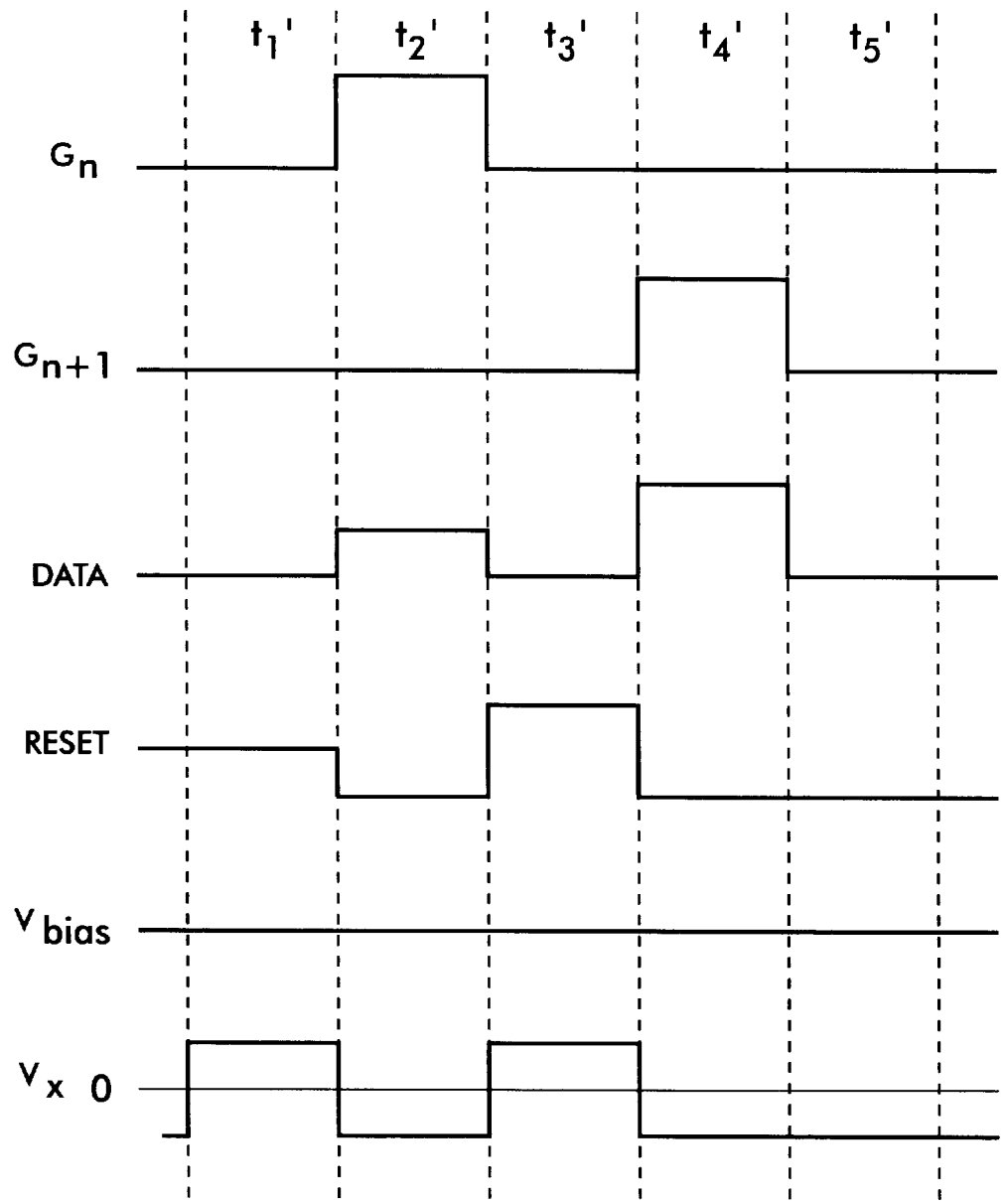
FIG. 12 is a timing chart showing the state of certain lines at various times in a circuit according to another embodiment of the present invention.

The timing diagrams of FIGS. 11 and 12 correspond to the two embodiments shown in FIGS. 9 and 10, respectively. With regard to FIG. 11, it will be noted that each gate has a specific on-time, $t_2$, $t_4$, etc. At the start of each gate on-time the data line is provided with a charge for resetting the photosensor capacitance of the immediately preceding pixel. After the photosensor has been recharged, the data line is allowed to settle, for a time $t_s$, and the resulting current level is inversely proportional to the light incident on the photosensor. Since charge is applied to the data line to reset the previous pixel's photosensor for a known period of time (reset time), the data line is observed after this reset time (i.e., in an appropriate read-out window) to determine the photosensor charge. In order to speed up the read-out process, the charge for resetting the photosensors may be provided on a separate reset line.

With regard to FIG. 12, where a separate reset line is employed, the gate on-times may be reduced, since the data line is used solely for receiving data from the photosensors. This is illustrated by the narrower gate times in FIG. 12 as compared to FIG. 11. That is, $t_1'<t_1$, $t_2'<t_2$, etc.

It may also be seen from FIGS. 11 and 12 that the drive voltage ($V_X$, being the voltage at a node X) is synchronized with the gate addressing such that when the gate line is high the drive voltage is low. By providing the drive voltage only when reading out a pixel, the fixed pattern noise that results from leakage current through the poly-Si amplifier transistor and poly-Si pass transistor is eliminated. This synchronization may be accomplished by (1) externally addressing $V_{DD}$ synchronized with the gate addressing, (2) building peripheral bias circuits for each column of $V_{DD}$, or (3) building a bias circuit at the pixel level.

Circuit For Improved Linear Response Of Amplifier

Figure 13:
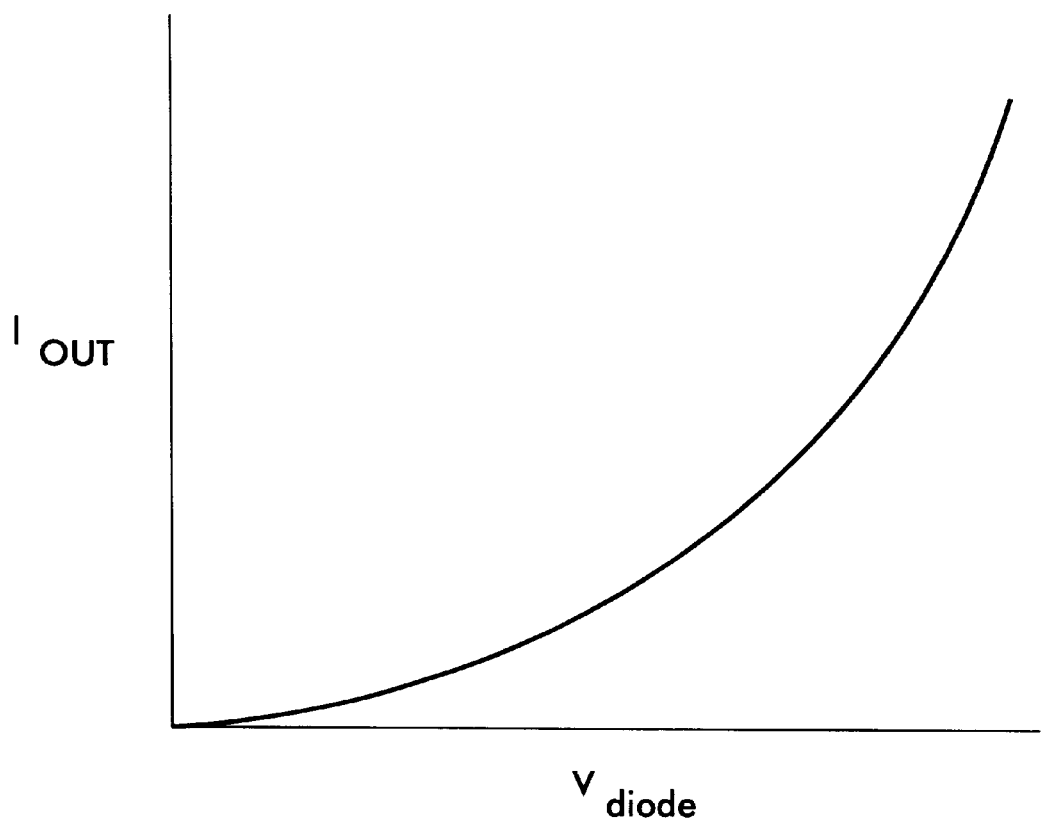
FIG. 13 is a transfer function for a circuit of the type shown in FIG. 1.

Several modifications to the circuits described above may be employed to obtain improved pixel amplification circuitry for amorphous silicon imaging sensor arrays. In the simplest amplification circuit, such as that shown in, and described with reference to, FIG. 1, the amplifier is a transistor configured as a common source amplifier, with its gate tied to the photosensor, its source at a voltage that is more negative than the sensor reset voltage, and its drain tied to the source of the pass transistor whose drain is connected to the data line. One difficulty with a common source amplifier of this type is that its output current is a nonlinear function of its gate-to-source voltage $V_{gs}$. In particular, for n-channel field effect transistors (FETs) operating below threshold, the drain-source current $I_{ds}$ is exponential as a function of $V_{gs}$, while for n-channel FETs operating above threshold, $I_{ds}$ is proportional to the quantity $[V_{gs}-V_{threshold}]^2$. A simple transfer function for a circuit of the type shown in FIG. 1 is shown in FIG. 13.

In practice, a p-i-n photosensor exhibits gain and offset variation. These variations may be corrected after readout by a two point (linear) correction known in the art. When an element with linear variation is amplified by an element with an exponential or quadratic transfer function, the resulting distortion takes the form of a power law variation across the array. Power law variations are more difficult to correct after readout, as a three-point (spline) or more general lookup-table computations are needed. The cost of these computations may be prohibitive for modest to high readout rates using conventional digital hardware. Further, a power-law variation may introduce an artificially high dynamic range in the output signal. If the signal is to be digitized, this may add cost, since in order to preserve the signal-to-noise ratio, the analog-to-digital converter must have increased bit depth. For example, a 14-bit ADC may be needed to faithfully obtain a signal that has a true 12-bit signal-to-noise ratio. Hence, there may be a need in some applications to largely preserve the linearity of the photosensor signal.

Figure 14:
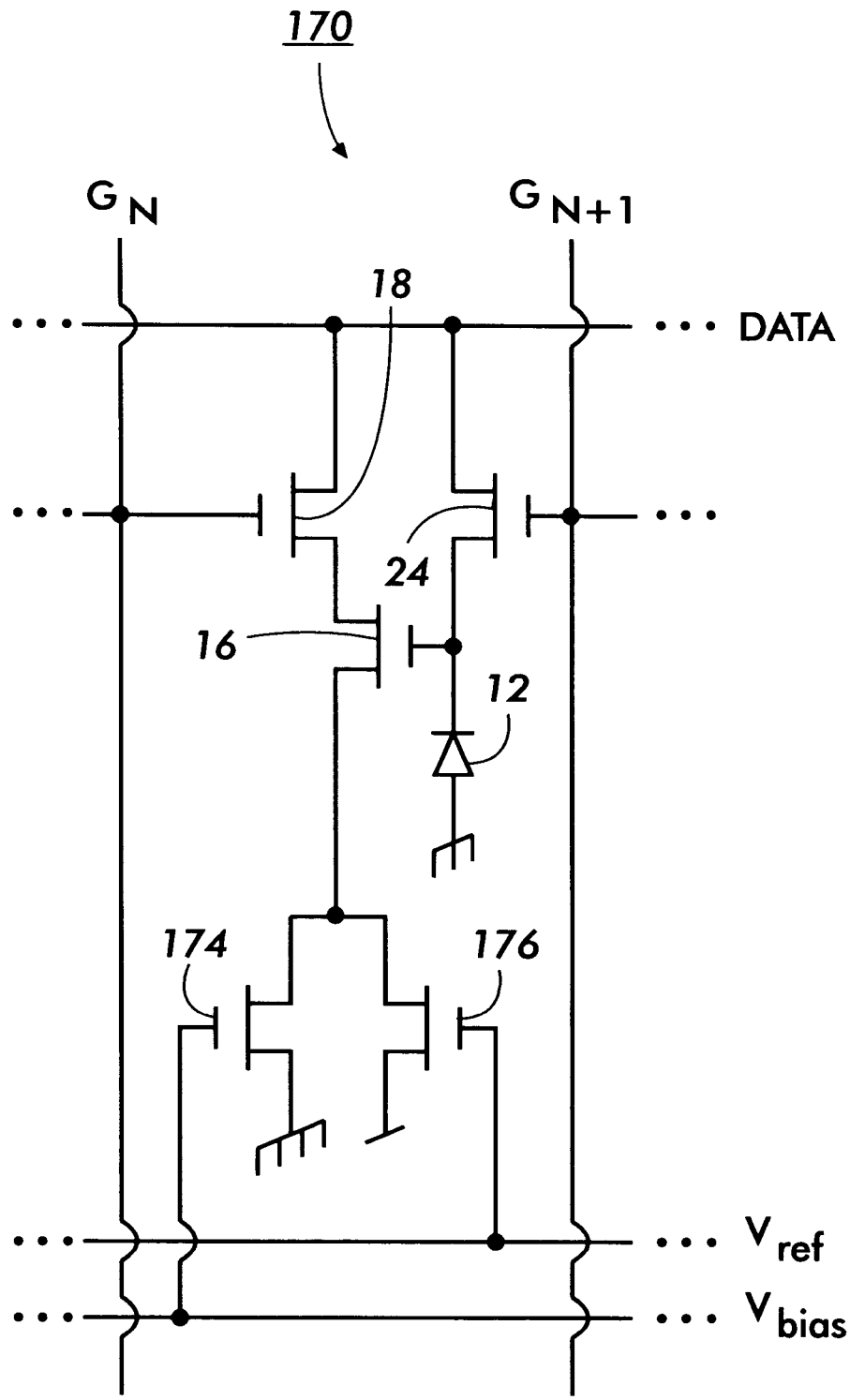
FIG. 14 shows a schematic illustration of a differential pair amplifier embodiment of the present invention employed to address the problem of nonlinear response.

A hybrid pixel amplifier with a differential pair amplifier may be employed to address the problem of nonlinearity. An example of such a circuit 170 is shown in FIG. 14. This circuit may replace the common-source circuit 10 of FIG. 1. In addition to the photosensor 12, amplifier transistor 16, the poly-Si pass transistor 18, and the a-Si reset transistor 24, circuit 170 includes bias transistor 174 and reference transistor 176. Furthermore, in place of a single bias line, circuit 170 includes a bias line $V_{bias}$ and a reference voltage line $V_{ref}$. As an example, $V_{bias}$ may be at −5 volts and $V_{ref}$ may be at 0 volts. The source of bias transistor 174 is tied to a voltage more negative than the sensor reset voltage, and its gate is tied to a global bias voltage. The drain of bias transistor 174 is connected to the source of reference transistor 176, each of which in turn being connected to the source of amplifier transistor 16. The gate of reference transistor 176 is tied to $V_{ref}$, which is at a voltage that lies between the voltage at which photosensor 12 is reset and the voltage that corresponds to the highest expected photosensor voltage after exposure to photons. The drain of reference transistor 176 is tied to a convenient positive system voltage. Each of bias transistor 174 and reference transistor 176 may be TFTs with poly-Si channel layers.

Figure 15:
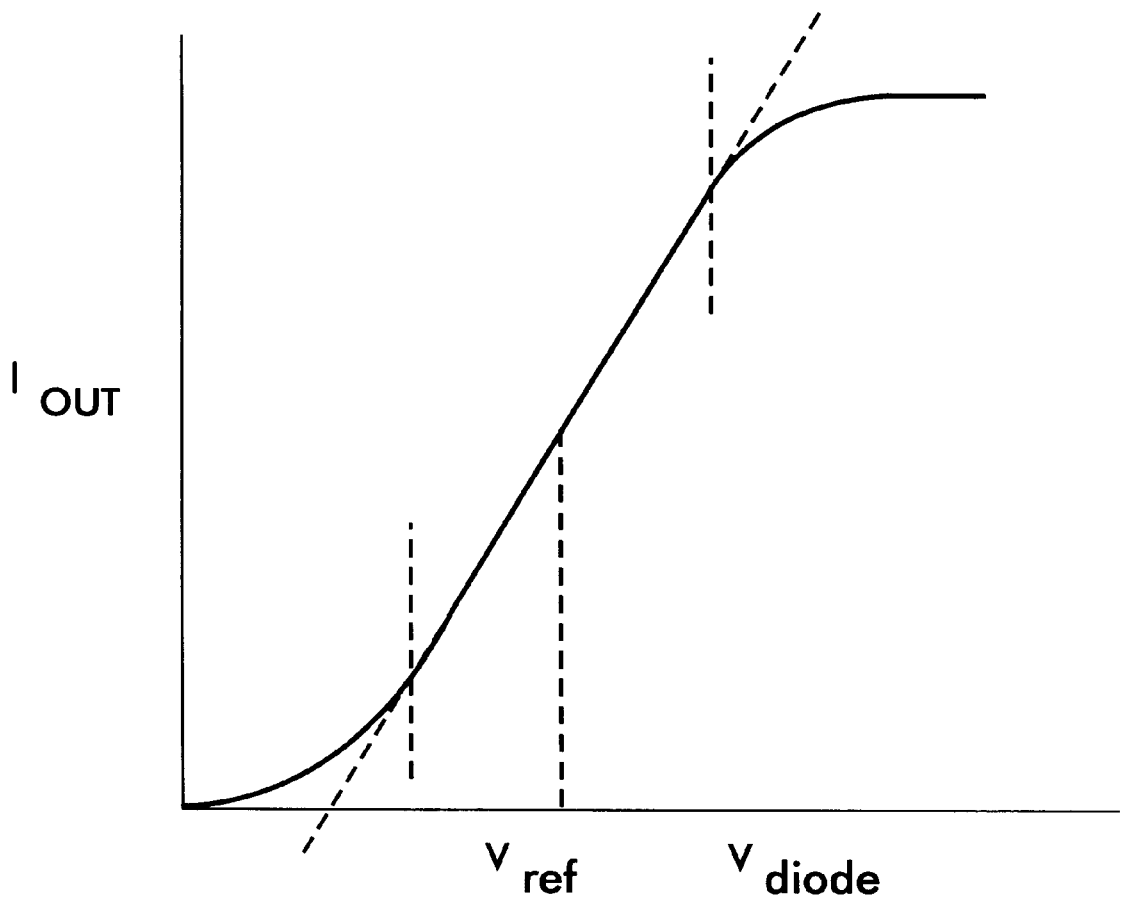
FIG. 15 shows a transfer function for the circuit of FIG. 14.

The net effect of this arrangement is that rather than sinking source current for amplifier transistor 16 through a power supply, as is the case for the single transistor common source amplifier of FIG. 1, amplifier transistor 16 sinks its current through bias transistor 174 in competition with reference transistor 176. An S-shaped hyperbolic tangent transfer function results, shown in FIG. 15. With the gate voltage of the bias transistor 174 represented as $V_g(bias)$, and the gate voltage of the reference transistor 176 represented as $V_g(ref)$, the voltage difference $[V_g(amp)-V_g(ref)]$ is the abscissa in FIG. 15, and $I_{out}$ through the amplifier transistor 16 is the ordinate in FIG. 15. The point at which $[V_g(amp)-V_g(ref)]=[V_{sensor}-V_{ref}]$~0, where $V_{sensor}$ is the photosensor voltage, is referred to as the point of current balance. In the region around current balance, the transfer function is nearly linear.

Circuit For Single-Event Response Pixel Amplification

Figure 16:
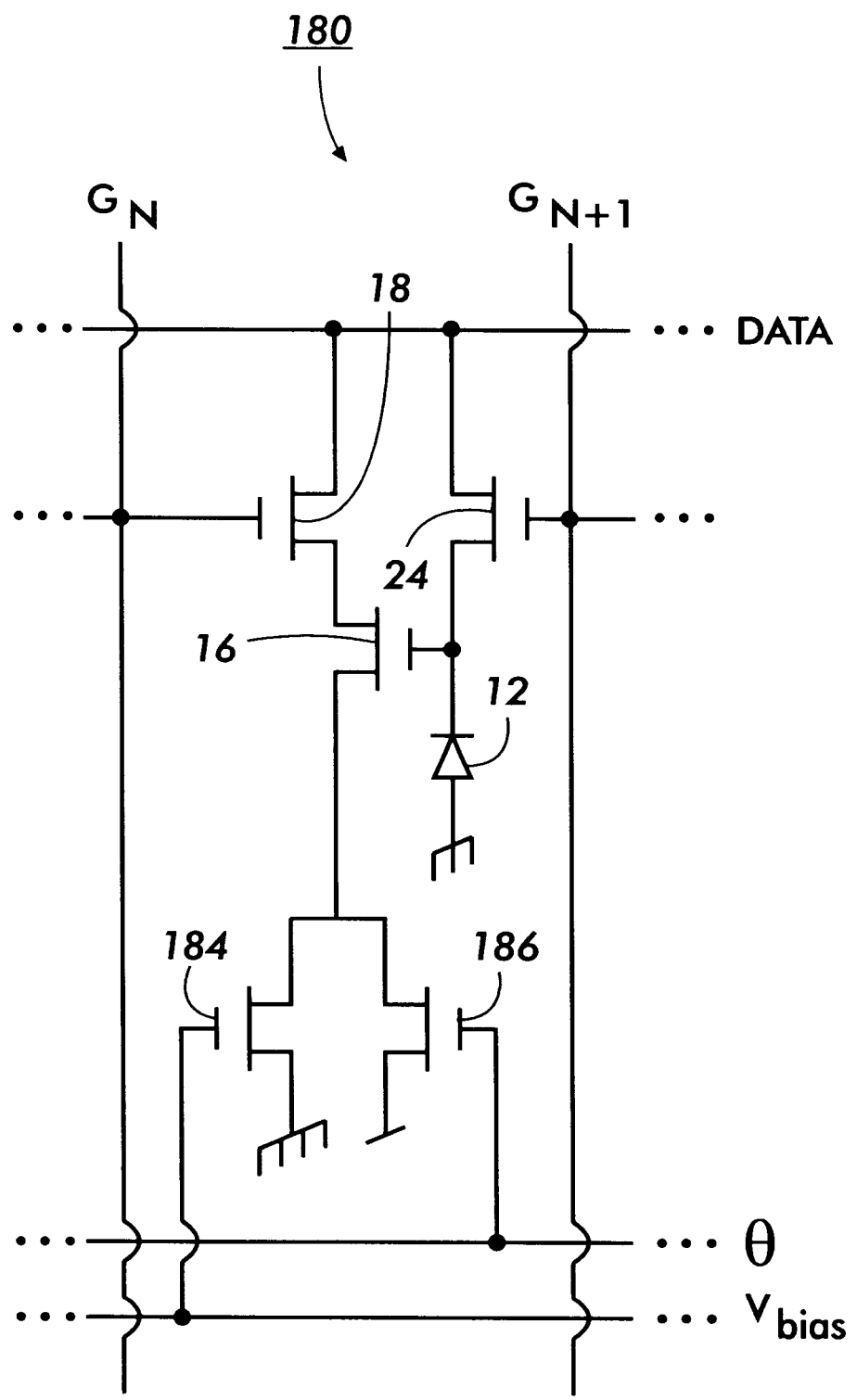
FIG. 16 shows a schematic illustration of a circuit providing single event sensing according to one embodiment of the present invention.
Figure 17:
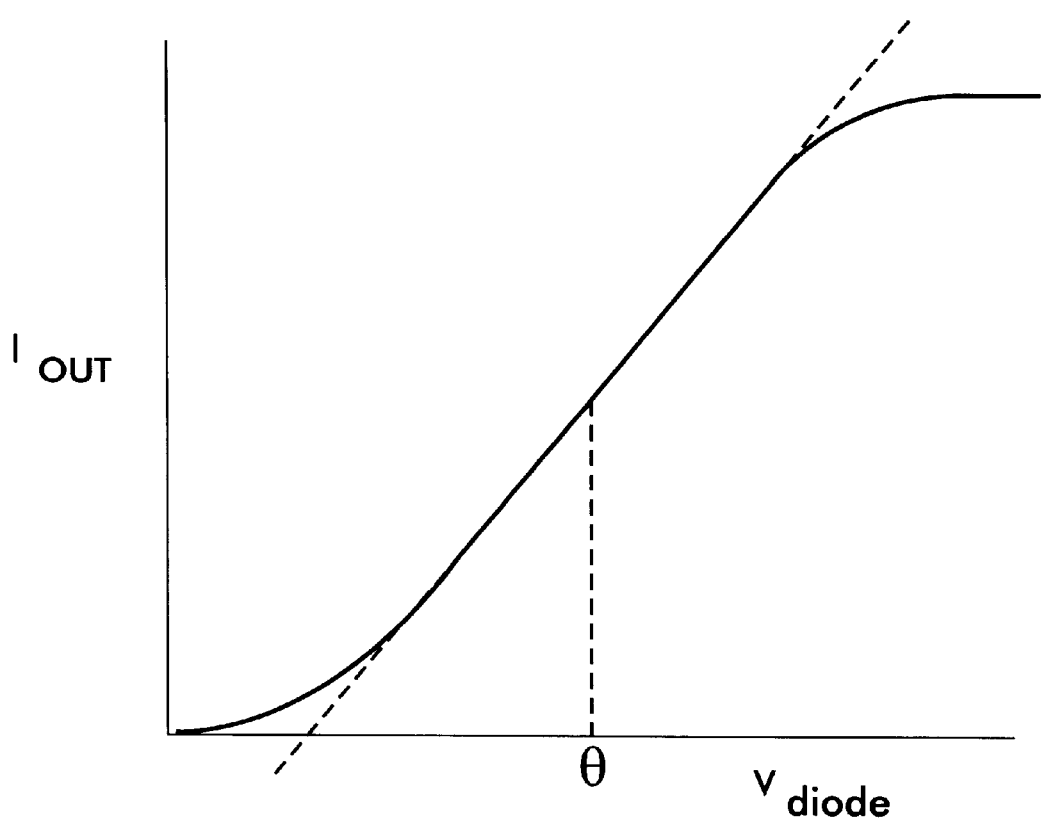
FIG. 17 shows a transfer function for the circuit of FIG. 16.
Figure 18:
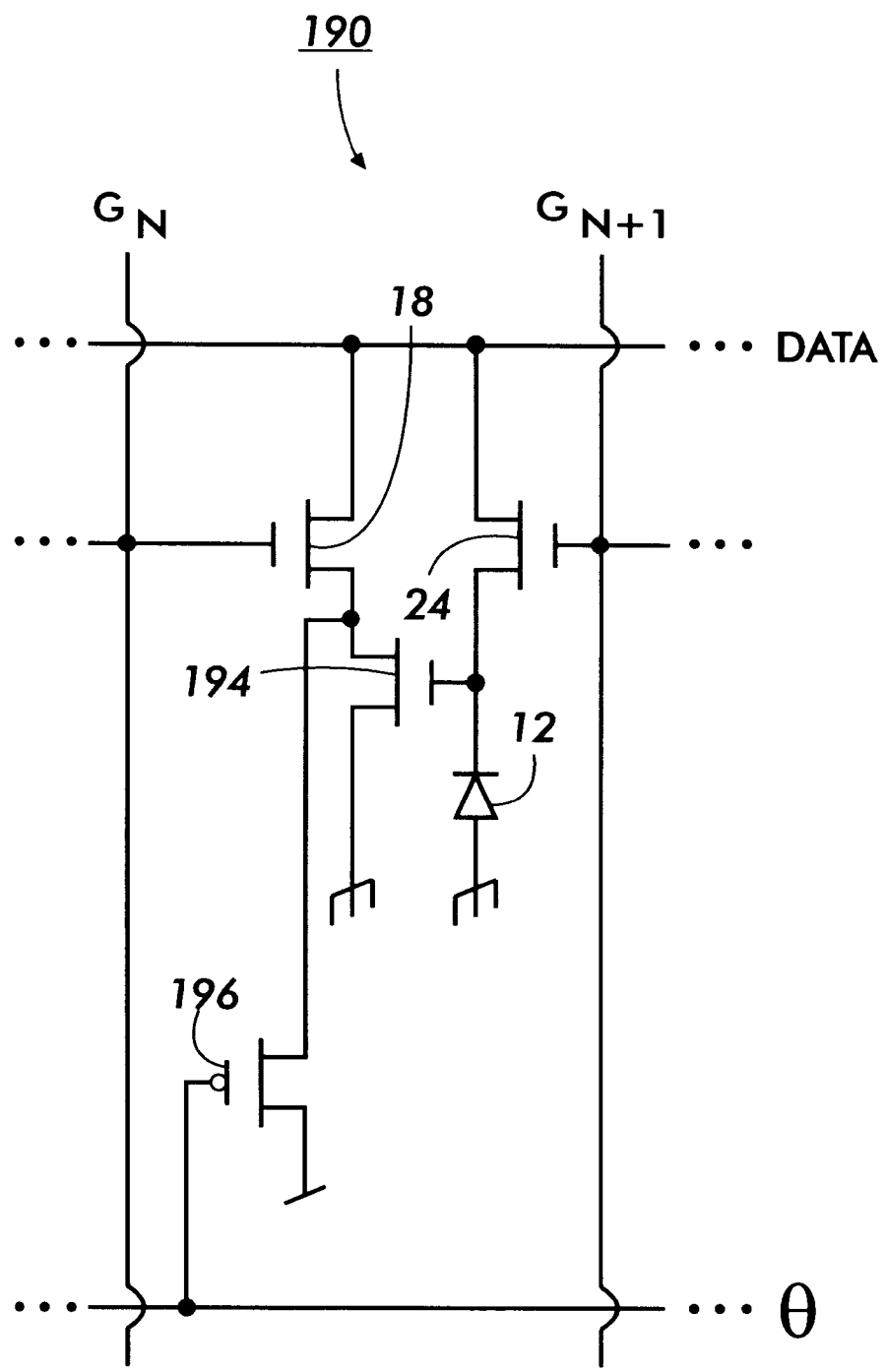
FIG. 18 shows a schematic illustration of a circuit providing single event sensing according to another embodiment of the present invention.

With reference now to FIGS. 16 through 18, there is shown therein two hybrid pixel amplifier circuits, and their respective transfer functions, which may be employed in single-event measuring, counting or other response, such as X-ray scattering measurement, or other applications with defined, punctuated illumination of an array. Such detection could be carried out via continuous-level (gray scale) readout of the array followed by digitization and threshold computation. However, the cost of the hardware required for readout at such relatively high precision may be excessive. Hence, improvements in the pixel circuitry have been developed to adapt the a-SI array technology described above suitable for this application. For such detection at the pixel level, two elements are needed within each pixel: a threshold element and a high-gain amplification element.

The circuit 180 illustrated in FIG. 16 is similar to the differential pair circuit 170 shown in FIG. 14. In circuit 180, the poly-Si pass transistor 18 and the a-Si reset transistor 24 are essentially as previously described. The source of bias transistor 184 is tied to a voltage more negative than the sensor reset voltage, and its gate is tied to a global bias voltage. The drain of bias transistor 184 is connected to the source of a threshold transistor 186 and to the source of amplifier transistor 16. The drain of threshold transistor 186 is tied to a convenient positive system voltage. The gate of threshold transistor 186 is tied to a voltage θ that lies between the voltage at which photosensor is reset and the voltage that corresponds to the highest expected photosensor voltage after exposure to photons. For example, the reset voltage may be 0 volts, the maximum voltage may be +5 volts, and the source voltage of bias transistor 184 may be −5 volts. In this case, the voltage θ should lie in the range of 0 to +5 volts. The photosensor voltage is read out on the data line only when the voltage at the photosensor ($V_p$) is greater than θ. The transfer function for this circuit is S-shaped, as before, and is shown in FIG. 17.

Figure 19:
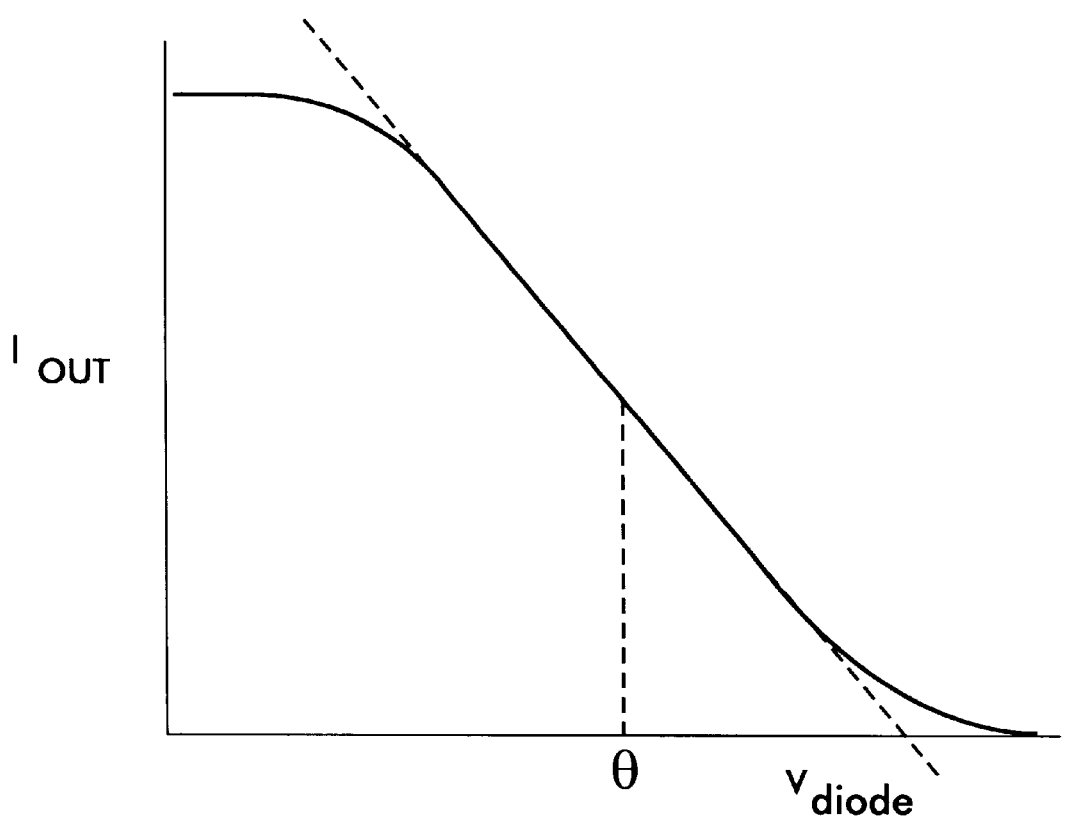
FIG. 19 shows a transfer function for the circuit of FIG. 18.

A second embodiment of a single-event response hybrid amplifier circuit 190 is shown in FIG. 18. This embodiment is referred to as a modified inverter threshold amplifier. As compared with the previously described circuits, amplifier transistor 194 in this case is a common source transistor amplifier of a first polarity type, such as an n-type field effect (nFET). a-Si reset transistor 24 is as previously described. An inverter transistor 196 is connected such that its gate is connected to a voltage θ, and its drain is connected to the drain of inverter transistor 194 and the source of poly-Si pass transistor 18. Inverter transistor 196 is a common source transistor amplifier of a second polarity type opposite the first polarity type, such as a p-type field effect (pFET). The source of amplifier transistor 194 is connected to the most negative voltage in the circuit, which also serves as the sensor bias voltage. The source of inverter transistor 196 is a convenient positive voltage. The circuit passes threshold when the sensor voltage (Vs), with respect to the source voltage of amplifier transistor 194, exceeds θ (i.e., at the gate of the inverter transistor 196), with respect to the source voltage of the inverter transistor 196. In this case, the output voltage drops to equal the source voltage of the amplifier transistor 194. With $V_{SD}(194)$ and $V_{SD}(196)$ as the source to drain voltages of transistors 194 and 196 respectively, below threshold, $[VS-V_{SD}(194)]<[V_{SD}(196)-\theta]$, and the output voltage rises to the source voltage of the inverter transistor 196, hence providing an inverted threshold output. The transfer function for this circuit is an inverted S-shape, and is shown in FIG. 19.

It will be appreciated that the foregoing description is intended to be illustrative. Variations and modifications of the descriptions provided herein will present themselves to those skilled in the art. For example, the focus of the descriptions herein have been on circuits including transistors of various types. However, other components such as resistors, capacitors, etc. may also be formed in circuits of the type described herein for reasons advantageous to a specific implementation. As a further example, the bias, threshold, and inverter transistors described above may be formed within or without each pixel, and may be formed on a shared substrate with the amplifier, reset, and pass transistors (e.g., within each pixel or at the array periphery), or may be formed on a separate substrate and attached as external circuitry. Such choices depend of the particular application to which the present invention is being addressed. Accordingly, the present description should not be read as limiting the scope of the claims except and unless indicated to the contrary.

What is claimed is:

1. In a circuit for converting sensory data to an electrical signal, of the type including a sensor, an amplifier connected such that an output of said sensor controls said amplifier, and a sensor reset connected to the sensor for selectively resetting a charge state of said sensor, an improvement comprising:

said sensor reset including a reset transistor, said reset transistor having a channel region formed of a conductive material having a first structural state;

said amplifier including an amplifier transistor, said amplifier transistor having a channel region formed of a conductive material having a converted first structural state; and said amplifier and reset transistors being formed on a shared substrate.

2. The improvement of claim 1, wherein said first structural state is amorphous and said converted first structural state is polycrystalline, and further wherein said conductive material is at least in substantial part silicon.

3. In a circuit for converting sensory data to an electrical signal, of the type including a sensor, an amplifier connected such that an output of said sensor controls said amplifier, and a sensor reset connected to the sensor for selectively resetting a charge state of said sensor, an improvement comprising:

said sensor reset including a reset transistor, said reset transistor having a channel region formed of amorphous silicon;

said amplifier including an amplifier transistor, said amplifier transistor having a channel region formed of polycrystalline silicon; and said amplifier and reset transistors being formed on a shared substrate.

4. The improvement of claim 3, wherein said amplifier transistor includes a source contact, and wherein said amplifier transistor source contact is in electrical communication with an input to said sensor.

5. The improvement of claim 3, wherein said amplifier transistor includes a source contact, and wherein said amplifier transistor source contact is in electrical communication with a drive voltage line, said drive voltage line having a first voltage, and wherein said sensor has an input in electrical communication with a bias voltage line, said bias voltage line having a second voltage different than said first voltage.

6. The improvement of claim 3, wherein said circuit for converting sensory data to an electrical signal further includes a pass transistor having source, gate, and drain contacts, and wherein the source contact of said pass transistor is in electrical communication with a drain contact of said amplifier transistor, wherein the gate contact of said pass transistor is in electrical communication with a first gate line, and wherein the drain contact of said pass transistor is in electrical communication with a data line.

7. The improvement of claim 6, wherein said reset transistor has a drain contact, and wherein said drain contact is in electrical communication with said data line.

8. The improvement of claim 6, wherein said reset transistor has a drain contact, and wherein said drain contact is in electrical communication with a reset line.

9. The improvement of claim 6, wherein said reset transistor has a gate contact in electrical communication with a second gate line.

10. An array of circuits for converting sensory data to electrical signals, each circuit in said array including the improvement of claim 1.

11. An array of circuits for converting image data to electrical signals, each circuit in said array including the improvement of claim 3.

12. A pixel amplifier circuit including a plurality of devices on a shared substrate, comprising:

a first gate line;

a second gate line;

a data line;

a bias line;

a sensor having first and second contacts;

a first device, said first device being a thin film sensor reset transistor, comprising:
- a first gate electrode over and in contact with said substrate, said first gate electrode having a desired width;
- a first dielectric layer over and in contact with said first gate electrode and the substrate;
- a first amorphous silicon layer over and in contact with said first dielectric layer, said first amorphous silicon layer having a width greater than the width of said first gate electrode;
- a second dielectric layer located over and in contact with said first amorphous silicon layer, said second dielectric layer having a width approximately equal to the width of said first gate electrode, said second dielectric layer being a nitride;
- a third dielectric layer located over and in contact with said second dielectric layer, said third dielectric layer having a width approximately equal to the width of said second dielectric layer, said third dielectric layer being an oxide;
- a second amorphous silicon layer disposed over and in contact with said first amorphous silicon layer and said third dielectric layer, said second amorphous silicon layer further in contact with said second dielectric layer, said second amorphous silicon layer having a width approximately equal to the width of the first amorphous silicon layer;
- an electrical contact layer located over and in contact with said second dielectric layer, said electrical contact layer having a width approximately equal to the width of said second amorphous silicon layer; and
- a gap defined by said second amorphous silicon layer and said electrical contact layer such that said second conductive layer and said electrical contact layer are separated by said gap into first and second regions thereof, each first and second region being electrically isolated from one another in the absence of an applied voltage;

a second device, said second device being a thin film amplifying transistor, comprising:
- a second gate electrode over and in contact with said substrate, said second gate electrode having a desired width;
- a first dielectric layer over and in contact with said second gate electrode and the substrate;
- a polycrystalline silicon layer over and in contact with said first dielectric layer, said polycrystalline silicon layer having a width greater than the width of the second gate electrode;
- a second dielectric layer located over and in contact with said polycrystalline silicon layer, said second dielectric layer having a width approximately equal to the width of the second contact region, said second dielectric layer being an oxide;
- an absorption layer located over and in contact with said second dielectric layer, said absorption layer having a width approximately equal to the width of the second dielectric layer, said absorption layer being amorphous silicon;
- an amorphous silicon layer disposed over and in contact with said polycrystalline silicon layer and said absorption layer, and further in contact with said second dielectric layer, said amorphous silicon layer having a width approximately equal to the width of the polycrystalline layer;
- an electrical contact layer located over and in contact with said amorphous silicon layer; and
- a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage; and a third device, said third device being a thin film pass transistor, comprising:
- a third gate electrode over and in contact with said substrate, said third gate electrode having a desired width;
- a first dielectric layer over and in contact with said third gate electrode and the substrate;
- a polycrystalline silicon layer over and in contact with said first dielectric layer, said polycrystalline silicon layer having a width greater than the width of the third gate electrode;
- a second dielectric layer located over and in contact with said polycrystalline silicon layer, said second dielectric layer having a width approximately equal to the width of the third gate electrode, said second dielectric layer being an oxide;
- an absorption layer located over and in contact with said second dielectric layer, said absorption layer having a width approximately equal to the width of the second dielectric layer, said absorption layer being amorphous silicon;
- an amorphous silicon layer disposed over and in contact with said polycrystalline silicon layer and said absorption layer, and further in contact with said second dielectric layer, said amorphous silicon layer having a width approximately equal to the width of the polycrystalline layer;
- an electrical contact layer located over and in contact with said amorphous silicon layer; and
- a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage;

said first contact of said sensor being in electrical communication with said bias line;

said first region of said contact layer of said reset transistor being in electrical communication with said second contact of said sensor;

said second region of said contact layer of said reset transistor being in electrical communication with said data line;

said first gate electrode being in electrical communication with said first gate line;

said first region of said contact layer of said amplifier transistor being in electrical communication with said bias line;

said second gate electrode being in electrical communication with said second contact of said sensor;

said second region of said contact layer of said amplifier transistor being in electrical communication with said first region of said contact layer of said pass transistor;

said third gate electrode being in electrical communication with said second gate line; and said second region of said contact layer of said pass transistor being in electrical communication with said data line.

13. A pixel amplifier circuit including a plurality of devices on a shared substrate, comprising:

a first gate line;

a second gate line;

a data line;

a reset line;

a bias line;

a sensor having first and second contacts;

a first device, said first device being a thin film sensor reset transistor, comprising:
 a first gate electrode over and in contact with said substrate, said first gate electrode having a desired width;
 a first dielectric layer over and in contact with said first gate electrode and the substrate;
 a first amorphous silicon layer over and in contact with said first dielectric layer, said first amorphous silicon layer having a width greater than the width of said first gate electrode;
 a second dielectric layer located over and in contact with said first amorphous silicon layer, said second dielectric layer having a width approximately equal to the width of said first gate electrode, said second dielectric layer being a nitride;
 a third dielectric layer located over and in contact with said second dielectric layer, said third dielectric layer having a width approximately equal to the width of said second dielectric layer, said third dielectric layer being an oxide;
 a second amorphous silicon layer disposed over and in contact with said first amorphous silicon layer and said third dielectric layer, said second amorphous silicon layer further in contact with said second dielectric layer, said second amorphous silicon layer having a width approximately equal to the width of the first amorphous silicon layer;
 an electrical contact layer located over and in contact with said second dielectric layer, said electrical contact layer having a width approximately equal to the width of said second amorphous silicon layer; and
 a gap defined by said second amorphous silicon layer and said electrical contact layer such that said second conductive layer and said electrical contact layer are separated by said gap into first and second regions thereof, each first and second region being electrically isolated from one another in the absence of an applied voltage;

a second device, said second device being a thin film amplifying transistor, comprising:
 a second gate electrode over and in contact with said substrate, said second gate electrode having a desired width;
 a first dielectric layer over and in contact with said second gate electrode and the substrate;
 a polycrystalline silicon layer over and in contact with said first dielectric layer, said polycrystalline silicon layer having a width greater than the width of the second gate electrode;
 a second dielectric layer located over and in contact with said polycrystalline silicon layer, said second dielectric layer having a width approximately equal to the width of the second contact region, said second dielectric layer being an oxide;
 an absorption layer located over and in contact with said second dielectric layer, said absorption layer having a width approximately equal to the width of the second dielectric layer, said absorption layer being amorphous silicon;
 an amorphous silicon layer disposed over and in contact with said polycrystalline silicon layer and said absorption layer, and further in contact with said second dielectric layer, said amorphous silicon layer having a width approximately equal to the width of the polycrystalline layer;
 an electrical contact layer located over and in contact with said amorphous silicon layer; and
 a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage; and a third device, said third device being a thin film pass transistor, comprising:
 a third gate electrode over and in contact with said substrate, said third gate electrode having a desired width;
 a first dielectric layer over and in contact with said third gate electrode and the substrate;
 a polycrystalline silicon layer over and in contact with said first dielectric layer, said polycrystalline silicon layer having a width greater than the width of the third gate electrode;
 a second dielectric layer located over and in contact with said polycrystalline silicon layer, said second dielectric layer having a width approximately equal to the width of the third gate electrode, said second dielectric layer being an oxide;
 an absorption layer located over and in contact with said second dielectric layer, said absorption layer having a width approximately equal to the width of the second dielectric layer, said absorption layer being amorphous silicon;
 an amorphous silicon layer disposed over and in contact with said polycrystalline silicon layer and said absorption layer, and further in contact with said second dielectric layer, said amorphous silicon layer having a width approximately equal to the width of the polycrystalline layer;

an electrical contact layer located over and in contact with said amorphous silicon layer; and a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage;

said first contact of said sensor being in electrical communication with said bias line;

said first region of said contact layer of said reset transistor being in electrical communication with said second contact of said sensor;

said second region of said contact layer of said reset transistor being in electrical communication with said reset line;

said first gate electrode being in electrical communication with said first gate line;

said first region of said contact layer of said amplifier transistor being in electrical communication with said bias line;

said second gate electrode being in electrical communication with said second contact of said sensor;

said second region of said contact layer of said amplifier transistor being in electrical communication with said first region of said contact layer of said pass transistor;

said third gate electrode being in electrical communication with said second gate line; and said second region of said contact layer of said pass transistor being in electrical communication with said data line.

14. A pixel amplifier circuit including a plurality of devices on a shared substrate, comprising:

a first gate line;

a second gate line;

a data line;

a bias line;

a drive voltage line;

a sensor having first and second contacts;

a first device, said first device being a thin film sensor reset transistor, comprising:
  a first gate electrode over and in contact with said substrate, said first gate electrode having a desired width;
  a first dielectric layer over and in contact with said first gate electrode and the substrate;
  a first amorphous silicon layer over and in contact with said first dielectric layer, said first amorphous silicon layer having a width greater than the width of said first gate electrode;
  a second dielectric layer located over and in contact with said first amorphous silicon layer, said second dielectric layer having a width approximately equal to the width of said first gate electrode, said second dielectric layer being a nitride;
  a third dielectric layer located over and in contact with said second dielectric layer, said third dielectric layer having a width approximately equal to the width of said second dielectric layer, said third dielectric layer being an oxide;
  a second amorphous silicon layer disposed over and in contact with said first amorphous silicon layer and said third dielectric layer, said second amorphous silicon layer further in contact with said second dielectric layer, said second amorphous silicon layer having a width approximately equal to the width of the first amorphous silicon layer;
  an electrical contact layer located over and in contact with said second dielectric layer, said electrical contact layer having a width approximately equal to the width of said second amorphous silicon layer; and
  a gap defined by said second amorphous silicon layer and said electrical contact layer such that said second conductive layer and said electrical contact layer are separated by said gap into first and second regions thereof, each first and second region being electrically isolated from one another in the absence of an applied voltage;

a second device, said second device being a thin film amplifying transistor, comprising:
  a second gate electrode over and in contact with said substrate, said second gate electrode having a desired width;
  a first dielectric layer over and in contact with said second gate electrode and the substrate;
  a polycrystalline silicon layer over and in contact with said first dielectric layer, said polycrystalline silicon layer having a width greater than the width of the second gate electrode;
  a second dielectric layer located over and in contact with said polycrystalline silicon layer, said second dielectric layer having a width approximately equal to the width of the second contact region, said second dielectric layer being an oxide;
  an absorption layer located over and in contact with said second dielectric layer, said absorption layer having a width approximately equal to the width of the second dielectric layer, said absorption layer being amorphous silicon;
  an amorphous silicon layer disposed over and in contact with said polycrystalline silicon layer and said absorption layer, and further in contact with said second dielectric layer, said amorphous silicon layer having a width approximately equal to the width of the polycrystalline layer;
  an electrical contact layer located over and in contact with said amorphous silicon layer; and
  a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage; and a third device, said third device being a thin film pass transistor, comprising:
  a third gate electrode over and in contact with said substrate, said third gate electrode having a desired width;
  a first dielectric layer over and in contact with said third gate electrode and the substrate;
  a polycrystalline silicon layer over and in contact with said first dielectric layer, said polycrystalline silicon layer having a width greater than the width of the third gate electrode;
  a second dielectric layer located over and in contact with said polycrystalline silicon layer, said second dielectric layer having a width approximately equal to the width of the third gate electrode, said second dielectric layer being an oxide;

an absorption layer located over and in contact with said second dielectric layer, said absorption layer having a width approximately equal to the width of the second dielectric layer, said absorption layer being amorphous silicon;

an amorphous silicon layer disposed over and in contact with said polycrystalline silicon layer and said absorption layer, and further in contact with said second dielectric layer, said amorphous silicon layer having a width approximately equal to the width of the polycrystalline layer;

an electrical contact layer located over and in contact with said amorphous silicon layer; and a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage;

said first contact of said sensor being in electrical communication with said bias line;

said first region of said contact layer of said reset transistor being in electrical communication with said second contact of said sensor;

said second region of said contact layer of said reset transistor being in electrical communication with said data line;

said first gate electrode being in electrical communication with said first gate line;

said first region of said contact layer of said amplifier transistor being in electrical communication with said drive voltage line;

said second gate electrode being in electrical communication with said second contact of said sensor;

said second region of said contact layer of said amplifier transistor being in electrical communication with said first region of said contact layer of said pass transistor;

said third gate electrode being in electrical communication with said second gate line; and said second region of said contact layer of said pass transistor being in electrical communication with said data line.

15. A pixel amplifier circuit including a plurality of devices on a shared substrate, comprising:
a first gate line;
a second gate line;
a data line;
a reset line;
a bias line;
a drive voltage line;
a sensor having first and second contacts;
a first device, said first device being a thin film sensor reset transistor, comprising:
a first gate electrode over and in contact with said substrate, said first gate electrode having a desired width;
a first dielectric layer over and in contact with said first gate electrode and the substrate;
a first amorphous silicon layer over and in contact with said first dielectric layer, said first amorphous silicon layer having a width greater than the width of said first gate electrode;

a second dielectric layer located over and in contact with said first amorphous silicon layer, said second dielectric layer having a width approximately equal to the width of said first gate electrode, said second dielectric layer being a nitride;

a third dielectric layer located over and in contact with said second dielectric layer, said third dielectric layer having a width approximately equal to the width of said second dielectric layer, said third dielectric layer being an oxide;

a second amorphous silicon layer disposed over and in contact with said first amorphous silicon layer and said third dielectric layer, said second amorphous silicon layer further in contact with said second dielectric layer, said second amorphous silicon layer having a width approximately equal to the width of the first amorphous silicon layer;

an electrical contact layer located over and in contact with said second dielectric layer, said electrical contact layer having a width approximately equal to the width of said second amorphous silicon layer; and a gap defined by said second amorphous silicon layer and said electrical contact layer such that said second conductive layer and said electrical contact layer are separated by said gap into first and second regions thereof, each first and second region being electrically isolated from one another in the absence of an applied voltage;

a second device, said second device being a thin film amplifying transistor, comprising:
a second gate electrode over and in contact with said substrate, said second gate electrode having a desired width;
a first dielectric layer over and in contact with said second gate electrode and the substrate;
a polycrystalline silicon layer over and in contact with said first dielectric layer, said polycrystalline silicon layer having a width greater than the width of the second gate electrode;
a second dielectric layer located over and in contact with said polycrystalline silicon layer, said second dielectric layer having a width approximately equal to the width of the second contact region, said second dielectric layer being an oxide;
an absorption layer located over and in contact with said second dielectric layer, said absorption layer having a width approximately equal to the width of the second dielectric layer, said absorption layer being amorphous silicon;
an amorphous silicon layer disposed over and in contact with said polycrystalline silicon layer and said absorption layer, and further in contact with said second dielectric layer, said amorphous silicon layer having a width approximately equal to the width of the polycrystalline layer;
an electrical contact layer located over and in contact with said amorphous silicon layer; and
a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage; and a third device, said third device being a thin film pass transistor, comprising:
- a third gate electrode over and in contact with said substrate, said third gate electrode having a desired width;
- a first dielectric layer over and in contact with said third gate electrode and the substrate;
- a polycrystalline silicon layer over and in contact with said first dielectric layer, said polycrystalline silicon layer having a width greater than the width of the third gate electrode;
- a second dielectric layer located over and in contact with said polycrystalline silicon layer, said second dielectric layer having a width approximately equal to the width of the third gate electrode, said second dielectric layer being an oxide;
- an absorption layer located over and in contact with said second dielectric layer, said absorption layer having a width approximately equal to the width of the second dielectric layer, said absorption layer being amorphous silicon;
- an amorphous silicon layer disposed over and in contact with said polycrystalline silicon layer and said absorption layer, and further in contact with said second dielectric layer, said amorphous silicon layer having a width approximately equal to the width of the polycrystalline layer;
- an electrical contact layer located over and in contact with said amorphous silicon layer; and
- a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage;

said first contact of said sensor being in electrical communication with said bias line;

said first region of said contact layer of said reset transistor being in electrical communication with said second contact of said sensor;

said second region of said contact layer of said reset transistor being in electrical communication with said reset line;

said first gate electrode being in electrical communication with said first gate line;

said first region of said contact layer of said amplifier transistor being in electrical communication with said drive voltage line;

said second gate electrode being in electrical communication with said second contact of said sensor;

said second region of said contact layer of said amplifier transistor being in electrical communication with said first region of said contact layer of said pass transistor;

said third gate electrode being in electrical communication with said second gate line; and said second region of said contact layer of said pass transistor being in electrical communication with said data line.

* * * * *